(12) United States Patent
Kim et al.

(10) Patent No.: US 11,688,342 B2
(45) Date of Patent: Jun. 27, 2023

(54) PIXEL AND ORGANIC LIGHT EMITTING DISPLAY DEVICE HAVING THE PIXEL

(71) Applicant: Samsung Display Co., Ltd., Yongin-Si (KR)

(72) Inventors: Tae Hoon Kim, Yongin-si (KR); Ji Hyun Ka, Yongin-si (KR); Seung Kyu Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/567,767

(22) Filed: Jan. 3, 2022

(65) Prior Publication Data

US 2022/0122537 A1   Apr. 21, 2022

Related U.S. Application Data

(63) Continuation of application No. 16/841,582, filed on Apr. 6, 2020, now Pat. No. 11,217,165, which is a continuation of application No. 15/887,027, filed on Feb. 2, 2018, now Pat. No. 10,614,758.

(30) Foreign Application Priority Data

Feb. 24, 2017   (KR) .................. 10-2017-0024876

(51) Int. Cl.
*G09G 3/30* (2006.01)
*G09G 3/3233* (2016.01)
(Continued)

(52) U.S. Cl.
CPC ....... *G09G 3/3233* (2013.01); *H01L 27/3262* (2013.01); *H01L 27/3265* (2013.01);
(Continued)

(58) Field of Classification Search
None
See application file for complete search history.

(56) References Cited

U.S. PATENT DOCUMENTS

| 9,276,050 B2 | 3/2016 | Kwon et al. |
| 9,384,692 B2 | 7/2016 | Choi |

(Continued)

FOREIGN PATENT DOCUMENTS

| CN | 105679247 A | 6/2016 |
| EP | 3349205 A1 | 7/2018 |

(Continued)

OTHER PUBLICATIONS

European Communication corresponding to European Patent Application No. 18158700.7 dated Nov. 22, 2019 6 pages.

(Continued)

*Primary Examiner* — Joseph R Haley
(74) *Attorney, Agent, or Firm* — Innovation Counsel LLP

(57) ABSTRACT

The present disclosure relates to a pixel displaying an image. A pixel includes an organic light emitting diode, a first transistor controlling an amount of current flowing from a first driving power supply to a second driving power supply via the organic light emitting diode in response to a voltage of a first node; a storage capacitor connected between the first node and the first driving power supply; a second transistor connected between a data line and the first node and turned on when a scan signal is supplied to a first scan line, and an auxiliary transistor connected between the second transistor and the data line and turned on when a scan signal is supplied to a second scan line. The second transistor and the auxiliary transistor have an overlapping turn-on period, and the second transistor is turned off before the auxiliary transistor is turned off.

20 Claims, 15 Drawing Sheets

(51) Int. Cl.
  *H01L 27/32*    (2006.01)
  *H01L 29/786*   (2006.01)
  *H01L 27/12*    (2006.01)

(52) U.S. Cl.
  CPC . *H01L 27/3276* (2013.01); *G09G 2300/0417* (2013.01); *G09G 2300/0426* (2013.01); *G09G 2300/0814* (2013.01); *G09G 2300/0819* (2013.01); *G09G 2300/0842* (2013.01); *G09G 2300/0861* (2013.01); *G09G 2320/0214* (2013.01); *G09G 2320/0219* (2013.01); *G09G 2320/0233* (2013.01); *G09G 2330/028* (2013.01); *H01L 27/124* (2013.01); *H01L 27/1225* (2013.01); *H01L 27/1255* (2013.01); *H01L 29/7869* (2013.01); *H01L 29/78672* (2013.01)

(56) References Cited

U.S. PATENT DOCUMENTS

| | | |
|---|---|---|
| 9,412,303 B2 | 8/2016 | Kim et al. |
| 2005/0269961 A1 | 12/2005 | Shibusawa et al. |
| 2006/0097966 A1 | 5/2006 | Choi |
| 2006/0145960 A1 | 7/2006 | Koga et al. |
| 2009/0091562 A1 | 4/2009 | Uchino et al. |
| 2010/0079507 A1 | 4/2010 | Yatabe et al. |
| 2011/0157143 A1 | 7/2011 | Choi et al. |
| 2013/0201172 A1 | 8/2013 | Jeong et al. |
| 2013/0321376 A1 | 12/2013 | Kim et al. |
| 2015/0154941 A1 | 6/2015 | Kanda et al. |
| 2016/0240142 A1 | 8/2016 | Jeong et al. |
| 2016/0351124 A1 | 12/2016 | Kim et al. |
| 2017/0140724 A1 | 5/2017 | Lin et al. |
| 2018/0182289 A1 | 6/2018 | Jung et al. |

FOREIGN PATENT DOCUMENTS

| | | |
|---|---|---|
| KR | 10-0496884 B1 | 6/2005 |
| KR | 10-2015-0146117 A | 12/2015 |
| KR | 10-1687069 B1 | 12/2016 |
| KR | 10-2018-0004369 A | 1/2018 |

OTHER PUBLICATIONS

Extended European Search Report, Application No. 18158700.7 dated Jun. 20, 2018, 10 pages.

PIXEL AND ORGANIC LIGHT EMITTING DISPLAY DEVICE HAVING THE PIXEL

RELATED APPLICATIONS

This application is a continuation application of U.S. patent application Ser. No. 16/841,582 filed on Apr. 6, 2020, which is a continuation application of U.S. patent application Ser. No. 15/887,027 filed on Feb. 2, 2018 (U.S. Pat. No. 10,614,758 issued on Apr. 7, 2020), which claims priority under 35 U.S.C. 119(a) to Korean Patent Application No. 10-2017-0024876 filed on Feb. 24, 2017 in the Korean Intellectual Property Office; the prior applications are incorporated by reference.

BACKGROUND

1. Field

An aspect of the present disclosure relates to a pixel and an organic light emitting display device having the same, and more particularly, to a pixel displaying an image of a desired luminance and an organic light emitting display device having the same.

2. Description of the Related Art

As information technology develops, the importance of a display device, which is a connection medium between a user and information, has been emphasized. Thus, the use of display devices such as a liquid crystal display device and an organic light emitting display device has been increased.

The organic light emitting display device, among the display devices, displays an image by using an organic light emitting diode that emits light by recombining an electron with a hole. The organic light emitting display device has advantages of a fast response speed and low power consumption.

The organic light emitting display device includes pixels connected to data lines and scan lines. The pixels each generally include an organic light emitting diode, and a driving transistor controlling the amount of current flowing into the organic light emitting diode. The driving transistor controls the amount of current flowing from a first driving power supply to a second driving power supply via the organic light emitting diode in response to a data signal. The organic light emitting diode emits light of a predetermined luminance corresponding to the amount of current from the driving transistor.

Recently, a method of achieving a high luminance by setting a voltage of the second driving power supply to be low or a method of reducing power consumption by driving the organic light emitting display device with a low frequency have been used. However, when the second driving power supply is set to be low, or the organic light emitting display device is driven with the low frequency, a predetermined leakage current may be generated from a gate electrode of the driving transistor. Because a voltage of a data signal may not be maintained during a single frame, an image of a desired luminance may not be displayed.

SUMMARY

Aspects of the present disclosure are directed to a pixel displaying an image of a desired luminance and an organic light emitting display device having the same.

According to an aspect of the present disclosure, there is provided a pixel including an organic light emitting diode, a first transistor controlling an amount of current flowing from a first driving power supply to a second driving power supply via the organic light emitting diode in response to a voltage of a first node, a storage capacitor connected between the first node and the first driving power supply, a second transistor connected between a data line and the first node and turned on when a scan signal is supplied to a first scan line, and an auxiliary transistor connected between the second transistor and the data line and turned on when a scan signal is supplied to a second scan line, wherein the second transistor and the auxiliary transistor have an overlapping turn-on period, and the second transistor is turned off before the auxiliary transistor is turned off.

The auxiliary transistor may be an N-type transistor.

The auxiliary transistor may be an oxide semiconductor transistor.

Each of the first transistor and the second transistor may be a P-type transistor.

Each of the first transistor and the second transistor may be a polysilicon semiconductor transistor.

The second transistor and the auxiliary transistor may be concurrently turned on.

The pixel may further include a third transistor formed at least one of between the first driving power supply and the first transistor and between the first transistor and an anode electrode of the organic light emitting diode and turned off when a light emitting control signal is supplied to a light emitting control line.

A turn-on period of the third transistor may not overlap a turn-on period of the second transistor.

According to another aspect of the present disclosure, there is provided a pixel including an organic light emitting diode, a first transistor connected between a first driving power supply connected to a first node and an anode electrode of the organic light emitting diode and controlling an amount of current supplied from the first driving power supply to the organic light emitting diode in response to a voltage of a second node, a storage capacitor connected between the second node and the first driving power supply, a second transistor connected between a data line and the first node and turned on when a first scan signal is supplied to an ith (i is a natural number) first scan line, a third transistor connected between a second electrode of the first transistor and the second node and turned on when the first scan signal is supplied, and an auxiliary transistor connected between the third transistor and a second electrode of the first transistor and turned on when a second scan signal is supplied to an ith second scan line, wherein the third transistor and the auxiliary transistor have an overlapping turn-on period, and the third transistor is turned off before the auxiliary transistor is turned off.

The auxiliary transistor may be an N-type transistor.

The auxiliary transistor may be an oxide semiconductor transistor.

Each of the first transistor, the second transistor, and the third transistor may be a P-type transistor.

Each of the first transistor, the second transistor, and the third transistor may be a polysilicon semiconductor transistor.

The third transistor and the auxiliary transistor may be concurrently turned on.

The pixel may further include a fourth transistor connected between the second node and a first power supply and turned on when a scan signal is supplied to an ith third scan line, and a fifth transistor connected between the anode electrode of the organic light emitting diode and the first power supply and turned on when a scan signal is supplied to an ith fourth scan line.

Each of the fourth transistor and the fifth transistor may be a P-type transistor.

Each of the fourth transistor and the fifth transistor may be a polysilicon semiconductor transistor.

The ith third scan line may be an (i-1)th first scan line, and the ith fourth scan line may be an ith first scan line.

Each of the fourth transistor and the fifth transistor may be an N-type transistor.

Each of the fourth transistor and the fifth transistor may be an oxide semiconductor transistor.

The ith third scan line may be an (i-1)th second scan line, and the ith fourth scan line may be the ith second scan line.

The pixel may further include a sixth transistor connected between the first driving power supply and the first node, wherein the sixth transistor is turned on except when a light emitting control signal is supplied to an ith light emitting control line, and a seventh transistor connected between a second electrode of the first transistor and the anode electrode of the organic light emitting diode and turned on and off simultaneously with the sixth transistor.

A turn-on period of the sixth transistor may not overlap a turn-on period of the third transistor.

According to an aspect of the present disclosure, there is provided a pixel including an organic light emitting diode, a first transistor connected between an anode electrode of the organic light emitting diode connected to a second node and a first driving power supply and controlling an amount of current supplied from the first driving power supply to the organic light emitting diode in response to a voltage of a first node, a storage capacitor connected between the first node and the second node, a second transistor connected between a data line and the first node and turned on when a scan signal is supplied to a first scan line, and an auxiliary transistor connected between the second transistor and the data line and turned on when a scan signal is supplied to a second scan line, wherein the second transistor and the auxiliary transistor have an overlapping turn-on period, and the second transistor is turned off before the auxiliary transistor is turned off.

The auxiliary transistor may be an N-type transistor.

The auxiliary transistor may be an oxide semiconductor transistor.

Each of the first transistor and the second transistor may be an N-type transistor.

Each of the first transistor and the second transistor may be a polysilicon semiconductor transistor.

The second transistor and the auxiliary transistor may be concurrently turned on.

The pixel may further include a third transistor connected between the second node and a first power supply and turned on when a scan signal is supplied to a third scan line, a fourth transistor connected between the first driving power supply and a first electrode of the first transistor and turned off when a light emitting control signal is supplied to a light emitting control line, and a fifth transistor connected between a reference power supply and the first node and turned on when a scan signal is supplied to a fourth scan line.

Each of the third transistor and the fourth transistor may be an N-type polysilicon semiconductor transistor, and the fifth transistor may be an N-type oxide semiconductor transistor.

According to another aspect of the present disclosure, there is provided a pixel including an organic light emitting diode, a first transistor controlling an amount of current flowing from a first driving power supply to a second driving power supply via the organic light emitting diode in response to a voltage of a first node, a second transistor connected between the first node and a second electrode of the first transistor and turned on when a first scan signal is supplied to a first scan line, a storage capacitor connected between the first node and a second node, a third transistor connected between a data line and the second node and turned on when the first scan signal is supplied, and an auxiliary transistor connected between the data line and the third transistor and turned on when a second scan signal is supplied to a second scan line, wherein the third transistor and the auxiliary transistor have an overlapping turn-on period and the third transistor is turned off before the auxiliary transistor is turned off.

The auxiliary transistor may be an N-type transistor.

The auxiliary transistor may be an oxide semiconductor transistor.

Each of the first transistor, the second transistor, and the third transistor may be a P-type transistor.

Each of the first transistor, the second transistor, and the third transistor may be a polysilicon semiconductor transistor.

The third transistor and the auxiliary transistor may be concurrently turned on.

The pixel may further include a fourth transistor connected between the second node and a first power supply and turned off when an inverted light emitting control signal is supplied to an inverted light emitting control line, a fifth transistor connected between the first power supply and an anode electrode of the organic light emitting diode and turned on when the first scan signal is supplied, and a sixth transistor connected between the first transistor and the anode electrode of the organic light emitting diode and turned off when a light emitting control signal is supplied to a light emitting control line.

The fourth transistor and the sixth transistor may have an overlapping turn-on period.

A turn-on period of the fourth transistor may at least partially overlap a turn-on period of the second transistor.

The fourth transistor may be an N-type oxide semiconductor transistor, and each of the fifth transistor and the sixth transistor may be a P-type polysilicon semiconductor transistor.

According to an aspect of the present disclosure, there is provided a pixel including a first transistor disposed on a current path from a first driving power supply to a second driving power supply via an organic light emitting diode, and a second transistor and an auxiliary transistor serially connected on a leakage current path which is different from the current path, wherein the second transistor and the auxiliary transistor have an overlapping turn-on period, and the second transistor is turned off before the auxiliary transistor is turned off.

The second transistor may be electrically connected to a gate electrode of the first transistor.

The auxiliary transistor may be an N-type transistor.

The auxiliary transistor may be an oxide semiconductor transistor.

The second transistor may be a polysilicon semiconductor transistor.

The second transistor and the auxiliary transistor may be concurrently turned on.

According to an aspect of the present disclosure, there is provided an organic light emitting display device including pixels connected to scan lines and data lines, wherein each of the pixels may include a first transistor disposed on a current path from a first driving power supply to a second driving power supply via an organic light emitting diode, and a second transistor and an auxiliary transistor serially connected on a leakage current path which is different from the current path, wherein the second transistor and the auxiliary transistor have an overlapping turn-on period, and the second transistor is turned off before the auxiliary transistor is turned off.

The second transistor may be electrically connected to a gate electrode of the first transistor.

The auxiliary transistor may be an N-type transistor.

The auxiliary transistor may be an oxide semiconductor transistor.

The second transistor may be a polysilicon semiconductor transistor.

The second transistor and the auxiliary transistor may be concurrently turned on.

According to an aspect of the present disclosure, there is provided an organic light emitting display device including a driving transistor and an organic light emitting diode serially connected between a first driving power supply and a second driving power supply, a switching transistor and an auxiliary transistor serially connected between a data line and the driving transistor, the auxiliary transistor being connected between the switching transistor and the data line. The switching transistor and the auxiliary transistor may include different active layers, respectively.

The auxiliary transistor may include an oxide semiconductor as an active layer.

The switching transistor may include poly silicon as an active layer.

The switching transistor and the auxiliary transistor may be concurrently turned on, and the switching transistor may be turned off before the auxiliary transistor is turned off.

DETAILED DESCRIPTION

Figure 1:
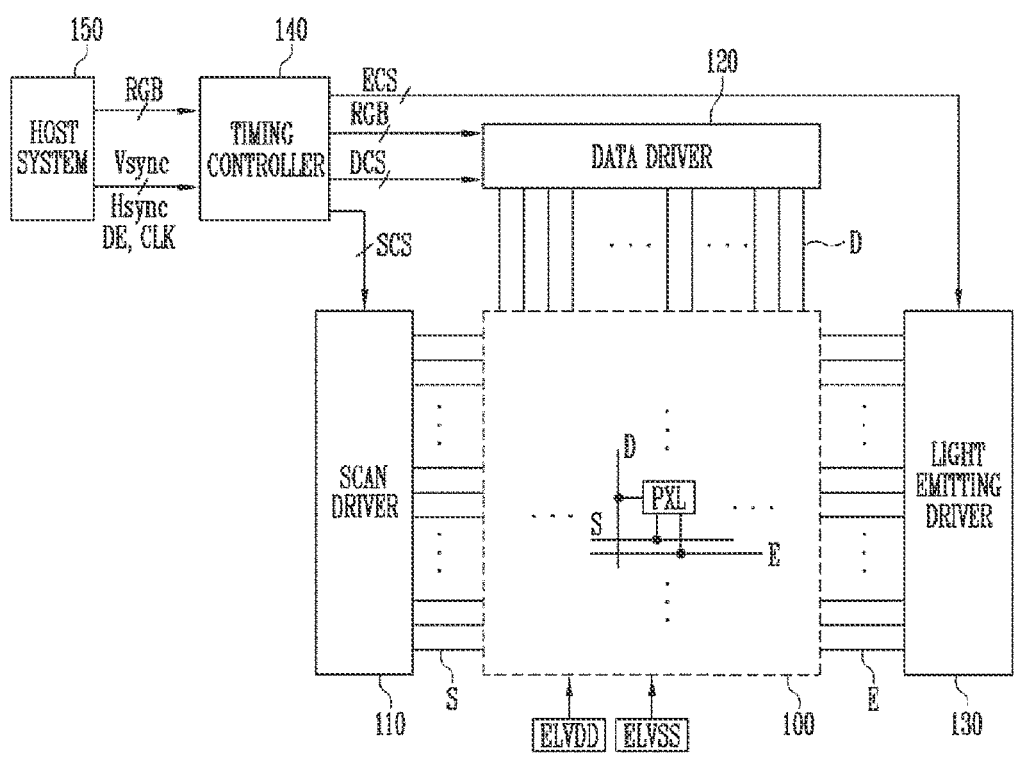
FIG. 1 is a schematic view illustrating a display device according to an embodiment of the present disclosure.

Hereinafter, embodiments of the present disclosure and other subject matters necessary for those skilled in the art to understand the contents of the present disclosure will be described in detail with reference to the accompanying drawings. However, we note that the present invention may be embodied in different other forms and should not be construed as being limited only to the embodiments set forth herein.

That is, the present disclosure is not limited to the embodiments described herein but may be embodied in other forms. It is also noted that in this specification, "coupled/coupled" refers to one component not only directly coupling another component but also indirectly coupling another component through an intermediate component. In addition, in the drawings, the same or similar constituent elements are denoted by the same reference numerals and marks as possible although shown in different drawings.

FIG. 1 is a schematic view illustrating a display device according to an embodiment of the present disclosure.

Referring to FIG. 1, a display device according to an embodiment of the present disclosure may include a pixel region 100, a scan driver 110, a data driver 120, a light emitting driver 130, a timing controller 140 and a host system 150.

The host system 150 may supply image data RGB to the timing controller 140 through a predetermined interface. In addition, the host system 150 may supply timing signals Vsync, Hsync, DE and CLK to the timing controller 140.

The timing controller 140 may generate a scan driving control signal SCS, a data driving control signal DCS and a light emitting driving control signal ECS based on the image data RGB and the timing signals including a vertical synchronization signal Vsync, a horizontal synchronization signal Hsync, a data enable signal DE and a clock signal CLK output from the host system 150. The scan driving control signal SCS generated by the timing controller 140 may be supplied to the scan driver 110, the data driving control signal DCS may be supplied to the data driver 120, and the light emitting driving control signal ECS may be supplied to the light emitting driver 130. In addition, the timing controller 140 may rearrange the image data RGB supplied from the host system 150 and supply the rearranged image data RGB to the data driver 120.

The scan driving control signal SCS may include a scan start pulse and clock signals. The scan start pulse may control first timing of a scan signal. The clock signals may be used for shifting the scan start pulse.

The data driving control signal DCS may include a source start pulse and clock signals. The source start pulse may control a sampling start point of data. The clock signals may be used for controlling a sampling operation.

The light emitting driving control signal ECS may include a light emitting start pulse and clock signals. The light emitting start pulse may control first timing of a light emitting control signal. The clock signals may be used for shifting the light emitting start pulse.

The scan driver 110 may supply scan signals to scan lines S in response to the scan driving control signal SCS. For example, the scan driver 110 may sequentially supply the scan signals to the scan lines S. When the scan signals are sequentially supplied to the scan lines S, pixels PXL may be selected in a unit of a horizontal line. The scan signals may be set to a gate-on voltage so that transistors included in the pixels PXL may be turned on.

The data driver 120 may supply data signals to data lines D in response to the data driving control signal DCS. The data signals supplied to the data lines D may be supplied to the pixels PXL selected by the scan signals. The data driver 120 may supply the data signals to the data lines D to be synchronized with the scan signals.

The light emitting driver 130 may supply light emitting control signals to light emitting control lines E in response to the light emitting driving control signal ECS. For example, the light emitting driver 130 may sequentially supply the light emitting control signals to the light emitting control lines E. When the light emitting control signals are sequentially supplied to the light emitting control lines E, the pixels PXL connected to a selected light emitting control line may not emit light. The light emitting control signals may be set to a gate-off voltage so that the transistors included in the pixels PXLs may be turned off.

In addition, a light emitting control signal supplied to an ith (i is a natural number) light emitting control line Ei may overlap a scan signal supplied to an ith scan line Si. During a period in which the data signals are supplied to the pixels PXL disposed on an ith horizontal line, the pixels PXL connected to the ith horizontal line may be set to a non-emission state, thereby preventing undesired generation of light from the pixels PXL.

FIG. 1 shows that the scan driver 110 and the light emitting driver 130 are separate drivers from each other, but the present disclosure is not limited thereto. For example, the scan driver 110 and the light emitting driver 130 may be formed as a single driver. In addition, the scan driver 110 and/or the light emitting driver 130 may be formed on a substrate by performing a thin film process. Further, the scan driver 110 and/or the light emitting driver 130 may be disposed on both sides with the pixel region 100 interposed therebetween.

The pixels PXL in the pixel region 100 may be connected to the data lines D, the scan lines S, and the light emitting control lines E, respectively. The pixels PXL may be supplied with a first driving power supply ELVDD and a second driving power supply ELVSS from an outside of the pixel region, for example, a power supply (not shown).

Each of the pixels PXL may be selected when the scan signal is supplied to the scan line S in which the each of the pixels PXL is connected and supplied with the data signal from the data line D. The pixel PXL supplied with the data signal may control the amount of current flowing from the first driving power supply ELVDD to the second driving power supply ELVSS via the organic light emitting diode (not shown) in response to the data signal. The organic light emitting diode may generate light of a predetermined luminance corresponding to the current flowing through the organic light emitting diode. Additionally, the first driving power supply ELVDD may be set to a higher voltage than the second driving power supply ELVSS.

FIG. 1 shows that each of the pixels PXL is connected to one scan line S, one data line D, and one light emitting control line E, but the present disclosure is not limited thereto. In other words, signal lines S, D, and E connected to the pixel PXL may vary depending on the pixel structure of the pixel PXL.

In addition, the pixel PXL may be connected to only the scan line S and the data line D. The light emitting control lines E and the light emitting driver 130 for driving the light emitting control lines E may be omitted.

Figure 2:
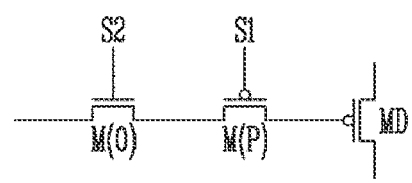
FIG. 2 is a view showing a connection between transistors according to an embodiment of the present disclosure for minimizing a leakage current.

FIG. 2 is a view showing a connection relation between transistors according to an embodiment of the present disclosure for minimizing a leakage current. The transistors shown in FIG. 2 may be included in the pixel PXL and disposed on a leakage path of a current.

Referring to FIG. 2, an oxide semiconductor transistor M(O) and a polysilicon semiconductor transistor M(P) may be formed on a leakage current path of the pixel PXL according to an embodiment of the present disclosure. For example, the polysilicon semiconductor transistor M(P) may be formed so as to be connected to a gate electrode of a driving transistor MD, and the oxide semiconductor transistor M(O) may be formed so as to be connected to the polysilicon semiconductor transistor M(P).

The oxide semiconductor transistor M(O) may include a gate electrode, a source electrode, and a drain electrode, and an active layer may be formed of an oxide semiconductor. The oxide semiconductor may be amorphous or crystalline. The oxide semiconductor transistor M(O) may be formed of an N-type transistor.

The oxide semiconductor transistor M(O) may be formed by performing a low temperature process and have a lower electron mobility than the polysilicon semiconductor transistor M(P). The oxide semiconductor transistor M(O) may have an excellent off current characteristic.

The polysilicon semiconductor transistor M(P) may include a gate electrode, a source electrode, and a drain electrode, and an active layer thereof may be formed of polysilicon. For example, the polysilicon semiconductor transistor M(P) may be set to a low temperature poly-silicon (LTPS) transistor. The polysilicon semiconductor transistor M(P) may be formed of a P-type transistor or an N-type transistor. However, for convenience of explanation, FIG. 2 shows that the polysilicon semiconductor transistor M(P) may be set to the P-type transistor. The polysilicon semiconductor transistor M(P) may have a high electron mobility and thus have a fast driving characteristic.

A first electrode of the polysilicon semiconductor transistor M(P) may be connected to the gate electrode of the driving transistor MD, and a second electrode thereof may be connected to a first electrode of the oxide semiconductor transistor M(O). In addition, a gate electrode of the polysilicon semiconductor transistor M(P) may be connected to a first scan line S1. The polysilicon semiconductor transistor M(P) may be turned on when a first scan signal is supplied to the first scan line S1.

A first electrode of the oxide semiconductor transistor M(O) may be connected to the second electrode of the polysilicon semiconductor transistor M(P). In addition, a gate electrode of the oxide semiconductor transistor M(O) may be connected to a second scan line S2. The oxide semiconductor transistor M(O) may be turned on when a second scan signal is supplied to the second scan line S2.

The polysilicon semiconductor transistor M(P) and the oxide semiconductor transistor M(O) may have an overlapping turn-on period, and the polysilicon semiconductor transistor M(P) may be turned off before the oxide semiconductor transistor M(O) is turned off.

Figure 3:
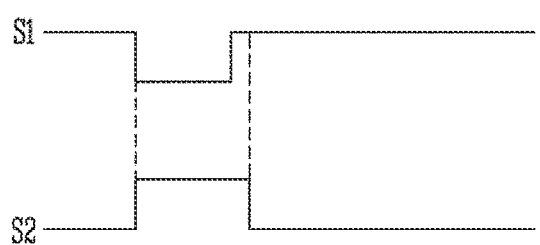
FIG. 3 is a waveform view showing an embodiment of a driving method of transistors of FIG. 2.

The first scan signal supplied to the first scan line S1 and the second scan signal supplied to the second scan line S2 may be simultaneously supplied as shown in FIG. 3. The polysilicon semiconductor transistor M(P) and the oxide semiconductor transistor M(O) may be simultaneously turned on. When the oxide semiconductor transistor M(O) is turned on simultaneously with the polysilicon semiconductor transistor M(P), a fast driving characteristic of the polysilicon semiconductor transistor M(P) may be ensured.

After the first scan signal to the first scan line S1 falls, the second scan signal to the second scan line S2 may fall. The oxide semiconductor transistor M(O) may be turned off after the polysilicon semiconductor transistor M(P) is turned off. When the polysilicon semiconductor transistor M(P) is turned off before the oxide semiconductor transistor M(O), the voltage variation of the gate electrode of the driving transistor MD may be minimized, thereby preventing image quality from being deteriorated.

In more detail, a capacitance of a channel capacitor of the oxide semiconductor transistor M(O) may be set to be greater than a capacitance of a channel capacitor of the polysilicon semiconductor transistor M(P). Therefore, when the polysilicon semiconductor transistor M(P) and the oxide semiconductor transistor M(O) are simultaneously turned off, a voltage of the gate electrode of the driving transistor MD may fluctuate by a predetermined voltage, and the image quality may be deteriorated accordingly.

On the contrary, according to an embodiment of the present disclosure, when the oxide semiconductor transistor M(O) is turned off after the polysilicon semiconductor transistor M(P) connected the gate electrode of the driving transistor MD is turned off, the voltage of the gate electrode of the driving transistor MD may be prevented from fluctuating by the channel capacitor of the oxide semiconductor transistor M(O). Additionally, when the oxide semiconductor transistor M(O) is turned off, the leakage current flowing through the leakage path may be minimized.

That is, according to an embodiment of present disclosure, the oxide semiconductor transistor M(O) and the polysilicon semiconductor transistor M(P) may form the leakage path of the pixel PXL, and the leakage current flowing through the leakage path may be minimized by using the oxide semiconductor transistor M(O). When the leakage current flowing through the leakage path is minimized, an image of a desired luminance may be displayed in the pixel PXL.

Additionally, a voltage change of the gate electrode of the driving transistor MD may be minimized by turning off the oxide semiconductor transistor M(O) after turning off the polysilicon semiconductor transistor M(P) connected to the gate electrode of the driving transistor MD.

Figure 4:
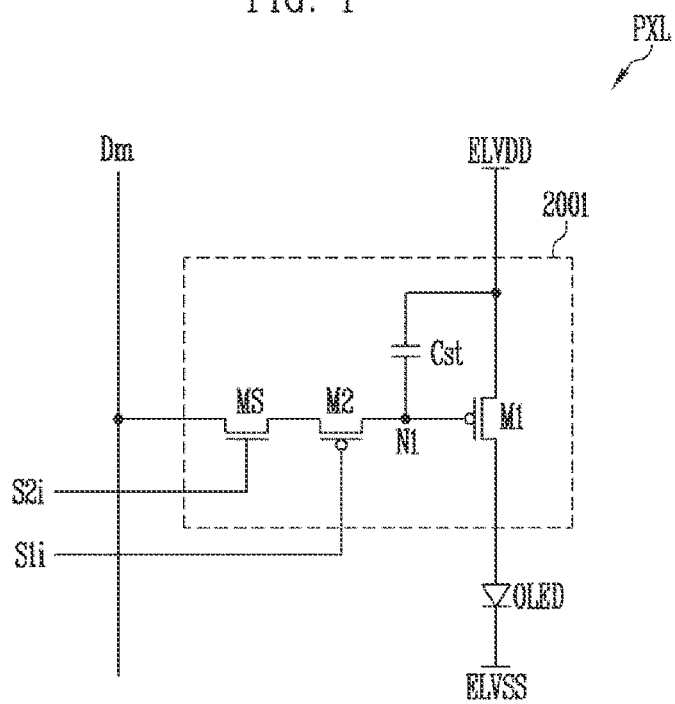
FIG. 4 is a view illustrating a pixel according to an embodiment of the present disclosure.

FIG. 4 is a view illustrating a pixel according to an embodiment of the present disclosure. For convenience of explanation, FIG. 4 shows that the pixel PXL is disposed on the ith horizontal line and connected to an mth data line Dm.

Referring to FIG. 4, the pixel PXL according to an embodiment of the present disclosure may include an organic light emitting diode OLED, and a pixel circuit 2001 controlling the amount of current supplied to the organic light emitting diode OLED.

An anode electrode of the organic light emitting diode OLED may be connected to the pixel circuit 2001, and a cathode electrode thereof may be connected to the second driving power supply ELVSS. The organic light emitting diode OLED may generate light of a predetermined luminance corresponding to the amount of current supplied from the pixel circuit 2001.

The pixel circuit 2001 may control the amount of current flowing from the first driving power supply ELVDD to the second driving power supply ELVSS via the organic light emitting diode OLED in response to the data signal. The pixel circuit 2001 may include a first transistor M1, a second transistor M2, an auxiliary transistor MS, and a storage capacitor Cst.

A first electrode of the first transistor M1 (a driving transistor) may be connected to the first driving power supply ELVDD, and a second electrode thereof may be connected to the anode electrode of the organic light emitting diode OLED. In addition, a gate electrode of the first transistor M1 may be connected to a first node N1. The first transistor M1 may control the amount of current flowing from the first driving power supply ELVDD to the second driving power supply ELVSS via the organic light emitting diode OLED in response to a voltage of the first node N1.

The second transistor M2 may be connected between the first node N1 and the auxiliary transistor MS. In addition, a gate electrode of the second transistor M2 may be connected to an ith first scan line S1$i$. The second transistor M2 may be turned on when the first scan signal is supplied to the ith first scan line S1$i$, thereby electrically connecting the auxiliary transistor MS and the first node N1.

The auxiliary transistor MS may be connected between the data line Dm and the second transistor M2. In addition, a gate electrode of the auxiliary transistor MS may be connected to an ith second scan line S2$i$. The auxiliary transistor MS may be turned on when the second scan signal is supplied to the ith second scan line S2$i$, thereby electrically connecting the data line Dm and the second transistor M2.

The storage capacitor Cst may be connected between the first node N1 and the first driving power supply ELVDD. The storage capacitor Cst may store a voltage corresponding to the data signal.

Each of the first transistor M1 and the second transistor M2 may be formed of a P-type polysilicon semiconductor transistor and the auxiliary transistor MS may be formed of an N-type oxide semiconductor transistor. When the first transistor M1 and the second transistor M2 are formed of polysilicon semiconductor transistors, a fast driving characteristic may be ensured. When the auxiliary transistor MS is formed of an oxide semiconductor transistor, the leakage current between the data line Dm and the first node N1 may be minimized, so that the pixel PXL may display an image of a desired luminance.

Figure 5:
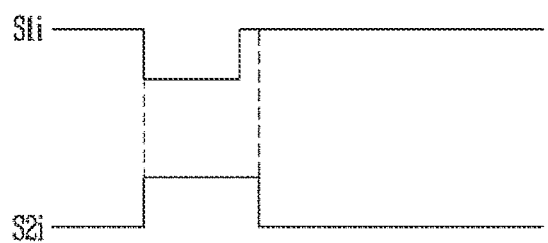
FIG. 5 is a waveform view showing an embodiment of a driving method of the pixel shown in FIG. 4.

FIG. 5 is a waveform view showing an embodiment of a driving method of the pixel shown in FIG. 4.

Referring to FIG. 5, the first scan signal may be supplied to the ith first scan line S1$i$, and the second scan signal may be supplied to the ith second scan line S2$i$. The first and second scan signals may be concurrently supplied.

When the first scan signal is supplied to the ith first scan line S1$i$, the second transistor M2 may be turned on. When the second scan signal is supplied to the ith second scan line S2$i$, the auxiliary transistor MS may be turned on.

When the auxiliary transistor MS and the second transistor M2 are turned on, the data line Dm and the first node N1 may be electrically connected, so that a data signal supplied to the data line Dm may be supplied to the first node N1 via the auxiliary transistor MS and the second transistor M2. The storage capacitor Cst may store a voltage corresponding to the data signal.

Thereafter, the first scan signal to the ith first scan line S1$i$ may fall, so that the second transistor M2 may be turned off. After the second transistor M2 is turned off, the second scan signal to the ith second scan line S2$i$ may fall, and the auxiliary transistor MS may be turned off accordingly. Since the second transistor M2 is set to a turn-off state, the voltage of the first node N1 may be prevented from being changed by a channel capacitor of the auxiliary transistor MS formed of an oxide semiconductor transistor.

After the auxiliary transistor MS is turned off, the first transistor M1 may control the amount of current flowing from the first driving power supply ELVDD to the second driving power supply ELVSS via the organic light emitting diode OLED in response to the voltage of the first node N1. The organic light emitting diode OLED may generate light of a predetermined luminance corresponding to the amount of current supplied from the first transistor M1.

Additionally, the auxiliary transistor MS may be set to a turn-off state when the organic light emitting diode OLED emits light. When the auxiliary transistor MS formed of the oxide semiconductor transistor is turned off, the leakage current between the data line Dm and the first node N1 may be minimized, thereby displaying an image of a desired luminance.

Figure 6A:
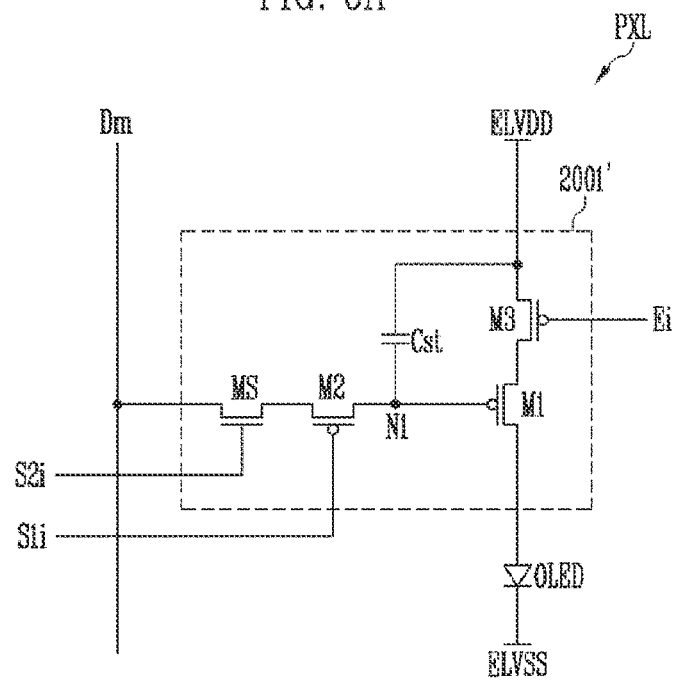
FIGS. 6A and 6B are views illustrating a pixel according to another embodiment of the present disclosure.
Figure 6B:
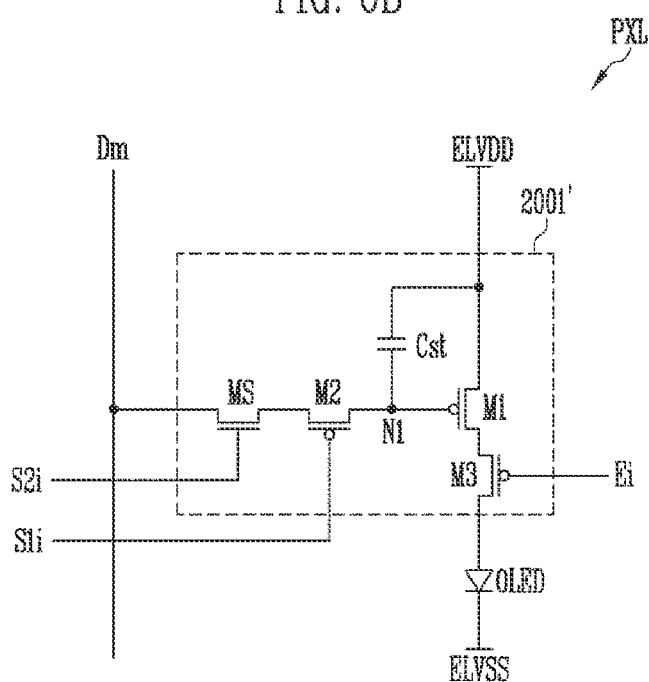

FIGS. 6A and 6B are views illustrating a pixel according to another embodiment of the present disclosure. In the description of FIGS. 6A and 6B, the same reference numerals will be given to the same constituents as those of FIG. 4, and a detailed description thereof will be omitted.

Referring to FIG. 6A, a pixel according to another embodiment of the present disclosure may include the organic light emitting diode OLED and a pixel circuit 2001' for controlling the amount of current supplied to the organic light emitting diode OLED.

The anode electrode of the organic light emitting diode OLED may be connected to the pixel circuit 2001', and the cathode electrode thereof may be connected to the second driving power supply ELVSS. The organic light emitting diode OLED may generate light of a predetermined luminance corresponding to the amount of current supplied from the pixel circuit 2001'.

The pixel circuit 2001' may control the amount of current flowing from the first driving power supply ELVDD to the second driving power supply ELVSS via the organic light emitting diode OLED in response to a data signal. The pixel circuit 2001' may include the first transistor M1, the second transistor M2, a third transistor M3, the auxiliary transistor MS, and the storage capacitor Cst.

The third transistor M3 may be disposed between the first driving power supply ELVDD and the first electrode of the first transistor M1. In addition, a gate electrode of the third transistor M3 may be connected to the ith light emitting control line Ei. The third transistor M3 may be turned off when a light emitting control signal is supplied to the ith light emitting control line Ei and turned on when the light emitting control signal is not supplied to the ith light emitting control line Ei.

The light emitting control signal supplied to the ith light emitting control line Ei may overlap the first scan signal supplied to the ith first scan line S1i and the second scan signal supplied to the ith second scan line S2i. Therefore, the third transistor M3 may be turned off when the voltage corresponding to the data signal is stored in the storage capacitor Cst, thereby preventing the organic light emitting diode OLED from unnecessarily emitting light.

Additionally, the first scan signal and the second scan signal may be set to a gate-on voltage. For example, the first scan signal supplied to the ith first scan line S1i may be set to a low voltage, which is the gate-on voltage, so that the second transistor M2 may be turned on. In addition, when the first scan signal is not supplied to the ith first scan line S1i, a high voltage, which is a gate-off voltage, may be supplied to the ith first scan line S1i.

In a similar manner, the second scan signal supplied to the ith second scan line S2i may be set to a high voltage, which is a gate-on voltage so that the auxiliary transistor MS may be turned on. In addition, when the second scan signal is not supplied to the ith second scan line S2i, a low voltage, which is a gate-off voltage, may be supplied to the ith second scan line S2i.

Additionally, the light emitting control signal may be set to a gate-off voltage. The light emitting control signal supplied to the light emitting control line Ei may be set to the high voltage, which is the gate-off voltage, so that the third transistor M3 may be turned off. In addition, when the light emitting control signal is not supplied to the ith light emitting control line Ei, a low voltage that is a gate-on voltage may be supplied to the ith light emitting control line Ei.

Referring to FIG. 6B, a pixel according to another embodiment of the present disclosure may include the organic light emitting diode OLED and the pixel circuit 2001' controlling the amount of current supplied to the organic light emitting diode OLED.

The anode electrode of the organic light emitting diode OLED may be connected to the pixel circuit 2001', and the cathode electrode thereof may be connected to the second driving power supply ELVSS. The organic light emitting diode OLED may generate the light of a predetermined luminance corresponding to the amount of current supplied from the pixel circuit 2001'.

The pixel circuit 2001' may control the amount of current flowing from the first driving power supply ELVDD to the second driving power supply ELVSS via the organic light emitting diode OLED in response to a data signal. The pixel circuit 2001' may include the first transistor M1 to the third transistor M3, the auxiliary transistor MS, and the storage capacitor Cst.

The third transistor M3 may be connected between the second electrode of the first transistor M1 and the anode electrode of the organic light emitting diode OLED. In addition, a gate electrode of the third transistor M3 may be connected to the ith light emitting control line Ei. The third transistor M3 may be turned off when a light emitting control signal is supplied to the ith light emitting control line Ei and turned on when the light emitting control signal is not supplied to the ith light emitting control line Ei.

Figure 7:
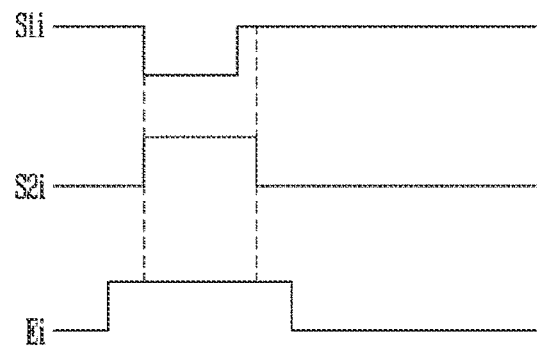
FIG. 7 is a waveform view showing an embodiment of a driving method of the pixel shown in FIGS. 6A and 6B.

The light emitting control signal supplied to the ith light emitting control line Ei may overlap the first scan signal supplied to the ith first scan line S1i and the second scan signal supplied to the ith second scan line S2i as shown in FIG. 7. Therefore, the third transistor M3 may be turned off when a voltage corresponding to the data signal is stored in the storage capacitor Cst, thereby preventing the organic light emitting diode OLED from unnecessarily emitting light.

Figure 8:
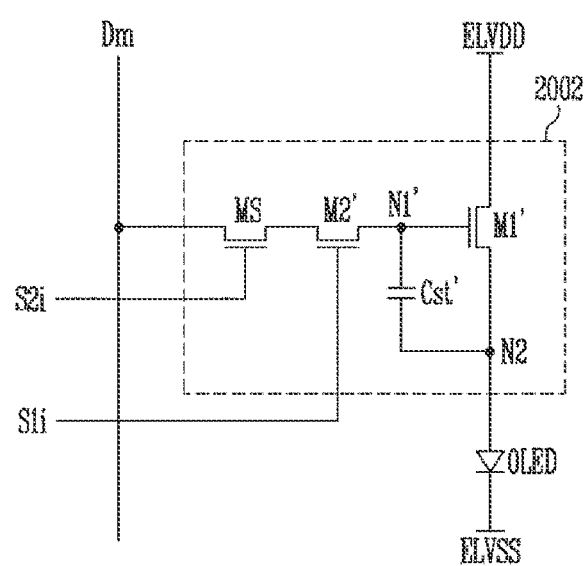
FIG. 8 is a view illustrating a pixel according to another embodiment of the present disclosure.

FIG. 8 is a view illustrating a pixel according to another embodiment of the present disclosure. For convenience of explanation, FIG. 8 shows the pixel PXL disposed on the ith horizontal line and connected to the mth data line Dm. In the description of FIG. 8, the same reference numeral will be given to the auxiliary transistor MS that functions the same as that of FIG. 4.

Referring to FIG. 8, the pixel PXL according to another embodiment of the present disclosure may include the organic light emitting diode OLED and a pixel circuit 2002 controlling the amount of current supplied to the organic light emitting diode OLED.

The anode electrode of the organic light emitting diode OLED may be connected to the pixel circuit 2002, and the cathode electrode thereof may be connected to the second driving power supply ELVSS. The organic light emitting diode OLED may generate light of a predetermined luminance corresponding to the amount of current supplied from the pixel circuit 2002.

The pixel circuit 2002 may control the amount of current flowing from the first driving power supply ELVDD to the second driving power supply ELVSS via the organic light emitting diode OLED in response to the data signal. The pixel circuit 2002 may include a first transistor M1', a second transistor M2', the auxiliary transistor MS, and a storage capacitor Cst'.

A first electrode of the first transistor M1' (a driving transistor) may be connected to the first driving power supply ELVDD, and a second electrode thereof may be connected to the anode electrode of the organic light emitting diode OLED. In addition, a gate electrode of the first transistor M1' may be connected to a first node N1'. The first transistor M1' may control the amount of current flowing from the first driving power supply ELVDD to the second driving power supply ELVSS via the organic light emitting diode OLED in response to a voltage of the first node N1'.

The second transistor M2' may be connected between the first node N1' and the auxiliary transistor MS. In addition, a gate electrode of the second transistor M2' may be connected to the ith first scan line S1$i$. The second transistor M2' may be turned on when the first scan signal is supplied to the ith first scan line S1$i$ to electrically connect the auxiliary transistor MS and the first node N1'.

The auxiliary transistor MS may be connected between the data line Dm and the second transistor M2'. In addition, the gate electrode of the auxiliary transistor MS may be connected to the ith second scan line S2$i$. The auxiliary transistor MS may be turned on when the scan signal is supplied to the ith second scan line S2$i$ to electrically connect the data line Dm and the second transistor M2'.

The storage capacitor Cst' may be connected between the first node N1' and the anode electrode (that is, a second node N2) of the organic light emitting diode OLED. The storage capacitor Cst' may store a voltage corresponding to the data signal.

Each of the first transistor M1' and the second transistor M2' may be formed of an N-type polysilicon semiconductor transistor, and the auxiliary transistor MS may be formed of an N-type oxide semiconductor transistor. When the first transistor M1' and the second transistor M2' are formed of a polysilicon semiconductor transistor, the fast driving characteristics may be secured. When the auxiliary transistor MS is formed of an oxide semiconductor transistor, the leakage current between the data line Dm and the first node N1' may be minimized, so that the pixel PXL may display an image of a desired luminance.

The pixel PXL shown in FIG. 8 is different from the pixel PXL shown in FIG. 4 in that the first transistor M1' and the second transistor M2' are N-type transistors. However, the pixel PXL shown in FIG. 8 and the pixel PXL shown in FIG. 4 perform substantially the same operations.

Figure 9:
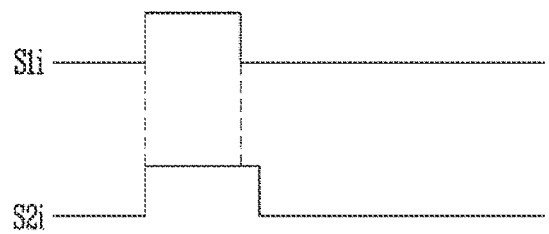
FIG. 9 is a waveform view showing an embodiment of a driving method of the pixel shown in FIG. 8.

FIG. 9 is a waveform view showing an embodiment of a driving method of the pixel shown in FIG. 8.

Referring to FIG. 9, the first scan signal may be supplied to the ith first scan line S1$i$, and the second scan signal may be supplied to the ith second scan line S2$i$. The first and second scan signals may be concurrently supplied.

When the first scan signal is supplied to the ith first scan line S1$i$, the second transistor M2' may be turned on. When the second scan signal is supplied to the ith second scan line S2$i$, the auxiliary transistor MS may be turned on.

When the auxiliary transistor MS and the second transistor M2' are turned on, the data line Dm and the first node N1' may be electrically connected. The data signal supplied to the data line Dm may be supplied to the first node N1' via the auxiliary transistor MS and the second transistor M2'. The storage capacitor Cst' may store the voltage corresponding to the data signal.

Thereafter, the supply of the first scan signal to the ith first scan line S1$i$ may fall, and the second transistor M2' may be turned off accordingly. After the second transistor M2' is turned off, the supply of the second scan signal to the ith second scan line S2$i$ may fall, so that the auxiliary transistor MS may be turned off accordingly. Since the second transistor M2' is set to a turn-off state, the voltage of the first node N1' may be prevented from being changed by the channel capacitor of the auxiliary transistor MS formed of the oxide semiconductor transistor.

After the auxiliary transistor MS is turned off, the first transistor M1' may control the amount of current flowing from the first driving power supply ELVDD to the second driving power supply ELVSS via the organic light emitting diode OLED in response to the voltage of the first node N1'. As a result, the organic light emitting diode OLED may generate light of a predetermined luminance corresponding to the amount of current supplied from the first transistor M1'.

Additionally, when the organic light emitting diode OLED emits light, the auxiliary transistor MS may be set to a turn-off state. When the auxiliary transistor MS formed of the oxide semiconductor transistor is turned off, the leakage current between the data line Dm and the first node N1' may be minimized, thereby displaying an image of a desired luminance.

Figure 10:
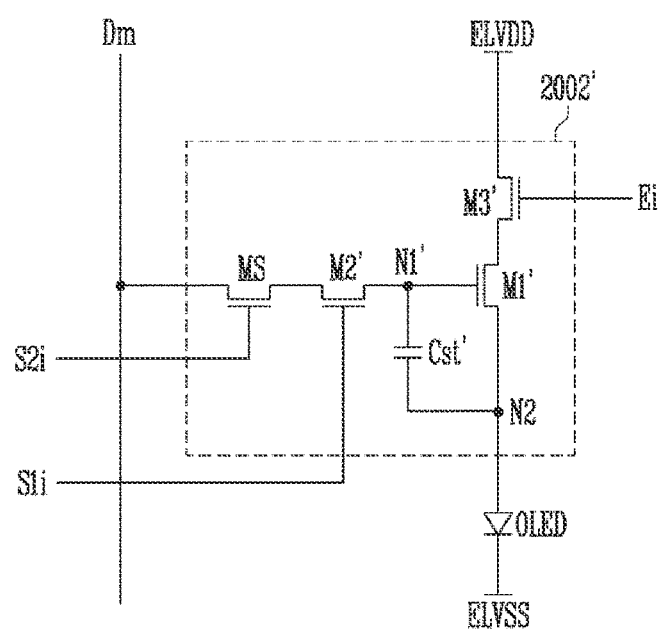
FIG. 10 is a view illustrating a pixel according to another embodiment of the present disclosure.

FIG. 10 is a view illustrating a pixel according to another embodiment of the present disclosure. In the description of FIG. 10, the same reference numerals will be given to the same constituents as those of FIG. 8, and a detailed description thereof will be omitted.

Referring to FIG. 10, the pixel PXL according to another embodiment of the present disclosure may include the organic light emitting diode OLED and a pixel circuit 2002' controlling the amount of current supplied to the organic light emitting diode OLED.

The anode electrode of the organic light emitting diode OLED may be connected to the pixel circuit 2002', and the cathode electrode thereof may be connected to the second driving power supply ELVSS. The organic light emitting diode OLED may generate light of a predetermined luminance corresponding to the amount of current supplied from the pixel circuit 2002'.

The pixel circuit 2002' may control the amount of current flowing from the first driving power supply ELVDD to the second driving power supply ELVDD via the organic light emitting diode OLED in response to the data signal. The pixel circuit 2002' may include the first transistor M1', the second transistor M2', and a third transistor M3', the auxiliary transistor MS, and the storage capacitor Cst'.

The third transistor M3' may be disposed between the first driving power supply ELVDD and the first electrode of the first transistor M1'. In addition, a gate electrode of the third transistor M3' may be connected to the ith light emitting control line Ei. The third transistor M3' may be turned off when the light emitting control signal is supplied to the ith light emitting control line Ei and turned on when the light emitting control signal is not supplied to the ith light emitting control line Ei.

Figure 11:
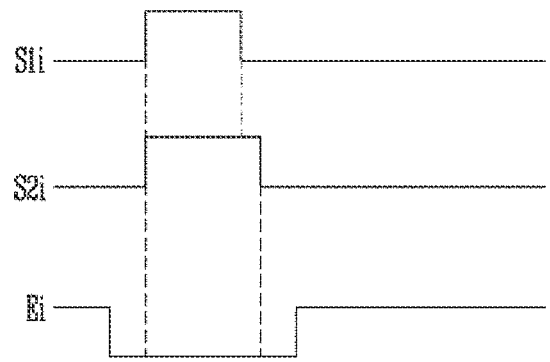
FIG. 11 is a waveform view showing an embodiment of a driving method of the pixel shown in FIG. 10.

The light emitting control signal supplied to the ith light emitting control line Ei may overlap the first scan signal supplied to the ith first scan line S1$i$ and the second scan signal supplied to the ith second scan line S2$i$ as shown in FIG. 11. Therefore, the third transistor M3' may be turned off when the voltage corresponding to the data signal is stored in the storage capacitor Cst', thereby preventing the organic light emitting diode OLED from unnecessarily emitting light.

Figure 12:
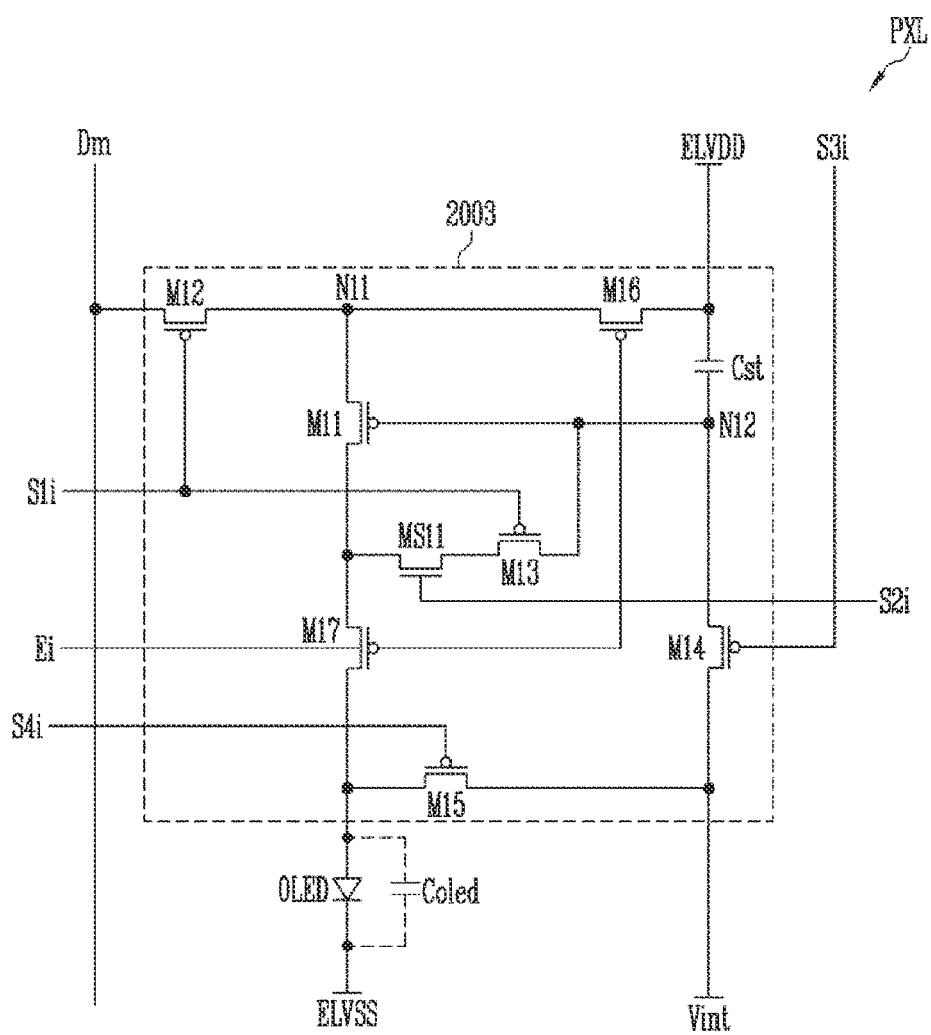
FIG. 12 is a view illustrating a pixel according to another embodiment of the present disclosure.

FIG. 12 is a view illustrating the pixel PXL according to another embodiment of the present disclosure. For convenience of explanation, FIG. 12 shows the pixel PXL disposed on the ith horizontal line and connected to the mth data line Dm.

Referring to FIG. 12, the pixel PXL according to another embodiment of the present disclosure may include the organic light emitting diode OLED, and a pixel circuit 2003 controlling the amount of current supplied to the organic light emitting diode OLED.

The anode electrode of the organic light emitting diode OLED may be connected to the pixel circuit 2003, and the cathode thereof may be connected to the second driving power supply ELVSS. The light emitting diode OLED may generate light of a predetermined luminance corresponding to the amount of current supplied from the pixel circuit 2003.

The pixel circuit 2003 may control the amount of current flowing from the first driving power supply ELVDD to the second driving power supply ELVSS via the organic light emitting diode OLED in response to the data signal. The pixel circuit 2003 may include eleventh, twelfth, thirteenth, fourteenth, fifteenth, sixteenth, and seventeenth transistors M11, M12, M13, M14, M15, M16 and M17, an auxiliary transistor MS11, and the storage capacitor Cst.

A first electrode of the eleventh transistor M11 (a driving transistor) may be connected to an eleventh node N11, and a second electrode thereof may be connected to the anode electrode of the organic light emitting diode OLED via the seventeenth transistor M17. In addition, a gate electrode of the eleventh transistor M11 may be connected to a twelfth node N12. The eleventh transistor M11 may control the amount of current flowing from the first driving power supply ELVDD to the second driving power supply ELVSS via the organic light emitting diode OLED in response to a voltage of the twelfth node N12. The first driving power supply ELVDD may be set to a voltage higher than the second driving power supply ELVSS.

The twelfth transistor M12 may be connected between the data line Dm and the eleventh node N11. In addition, a gate electrode of the twelfth transistor M12 may be connected to the ith first scan line S1$i$. The twelfth transistor M12 may be turned on when the first scan signal is supplied to the ith first scan line S1$i$ to electrically connect the data line Dm and the eleventh node N11.

The thirteenth transistor M13 may be connected between the twelfth node N12 and a second electrode of the eleventh transistor M11 through the auxiliary transistor MS11. In addition, a gate electrode of the thirteenth transistor M13 may be connected to the ith first scan line S1$i$. The thirteenth transistor M13 may be turned on when the first scan signal is supplied to the ith first scan line S1$i$.

The auxiliary transistor MS11 may be connected between the thirteenth transistor M13 and the second electrode of the eleventh transistor M11. In addition, the gate electrode of the auxiliary transistor MS may be connected to the ith second scan line S2$i$. The auxiliary transistor MS11 may be turned on when the second scan signal is supplied to the ith second scan line S2$i$. The auxiliary transistor MS11 may be formed of an N-type oxide semiconductor transistor.

The fourteenth transistor M14 may be connected between the twelfth node N12 and a first power supply Vint. In addition, a gate electrode of the fourteenth transistor M14 may be connected to an ith third scan line S3$i$. The fourteenth transistor M14 may be turned on when a third scan signal is supplied to the ith third scan line S3$i$ to supply a voltage of the first power supply Vint to the twelfth node N12. The first power supply Vint may be set to a lower voltage than the data signal supplied to the data line Dm. The third scan signal supplied to the ith third scan line S3$i$ may be supplied earlier than the first scan signal supplied to the ith first scan line S Accordingly, the ith third scan line S3$i$ may be set to an (i-1)th first scan line S1$i$-1.

The fifteenth transistor M15 may be connected between the anode electrode of the organic light emitting diode OLED and the first power supply Vint. In addition, a gate electrode of the fifteenth transistor M15 may be connected to an ith fourth scan line S4$i$. The fifteenth transistor M15 may be turned on when a fourth scan signal is supplied to the ith fourth scan line S4$i$ to supply the voltage of the first power supply Vint to the anode electrode of the organic light emitting diode OLED. The fourth scan signal supplied to the ith fourth scan line S4$i$ may overlap the light emitting control signal supplied to the ith light emitting control line Ei. Accordingly, the ith fourth scan line S4$i$ may be set to the ith first scan line S1$i$ or the ith third scan line S3$i$.

When the voltage of the first power supply Vint is supplied to the anode electrode of the organic light emitting diode OLED, a parasitic capacitor (hereinafter, referred to as an "organic capacitor Coled") of the organic light emitting diode OLED may be discharged. When the organic capacitor Coled is discharged, black expression capability of the pixel PXL may be enhanced.

In more detail, the organic capacitor Coled may charge a predetermined voltage corresponding to the current supplied from the pixel circuit 2003 during a previous frame period. When the organic capacitor Coled is charged, the organic light emitting diode OLED may easily emit light with a lower current.

A black data signal may be supplied to the pixel circuit 2003 during a current frame period. When the black data signal is supplied, the pixel circuit 2003 may not supply a current to the organic light emitting diode OLED ideally. However, the pixel circuit 2003 formed of transistors may supply a predetermined leakage current to the organic light emitting diode OLED even though the black data signal is supplied. When the organic capacitor Coled is charged, the light emitting diode OLED may slightly emit light, so that the black expression capability may be deteriorated.

On the contrary, as in the present disclosure, when the organic capacitor Coled is discharged by the first power supply Vint, the organic light emitting diode OLED may be set to a non-emission state even though the leakage current is supplied. That is, according to the present disclosure, the organic capacitor Coled may be discharged by using the first power supply Vint, so that the black expression capability may be enhanced.

The sixteenth transistor M16 may be connected between the first driving power supply ELVDD and the eleventh node N11. In addition, a gate electrode of the sixteenth transistor M16 may be connected to the ith light emitting control line Ei. The sixteenth transistor M16 may be turned off when the light emitting control signal is supplied to the ith light emitting control line Ei and turned on when the light emitting control signal is not supplied.

The seventeenth transistor M17 may be connected between the eleventh transistor M11 and the anode electrode of the organic light emitting diode OLED. In addition, a gate electrode of the seventeenth transistor M17 may be connected to the ith light emitting control line Ei. The seventeenth transistor M17 may be turned off when the light emitting control signal is supplied to the ith light emitting control line Ei and turned on when the light emitting control signal is not supplied.

The storage capacitor Cst may be connected between the first driving power supply ELVDD and the twelfth node N12. The storage capacitor Cst may charge the voltage corresponding to the data signal and a voltage corresponding to a threshold voltage of the eleventh transistor M11.

In the above-descried pixel PXL of the present disclosure, the eleventh transistor M11 to the seventeenth transistor M17 may be formed of P-type polysilicon semiconductor transistors. Specifically, the eleventh, sixteenth, and seventeenth transistors M11, M16, and M17 disposed on a current supply path for supplying a current to the organic light emitting diode OLED may be formed of P-type polysilicon semiconductor transistors. When the eleventh to seventeenth transistors M11 to M17 are formed of polysilicon semiconductor transistors, a fast driving characteristic may be ensured.

In addition, the auxiliary transistor MS11 may be formed of an N-type oxide semiconductor transistor. When the auxiliary transistor MS11 is formed of an oxide semiconductor transistor, the leakage current from the twelfth node N12 may be minimized, and the image of the predetermined luminance may be displayed in the pixel region 100 accordingly.

Figure 13:
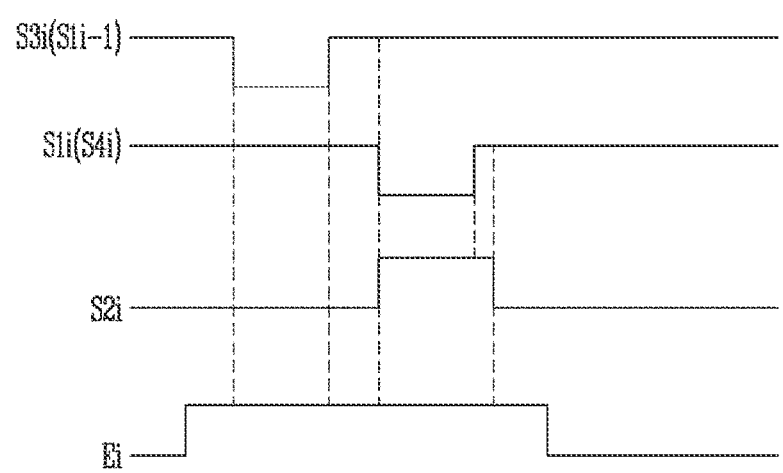
FIG. 13 is a waveform view showing an embodiment of a driving method of the pixel shown in FIG. 12.

FIG. 13 is a waveform view showing an embodiment of a driving method of the pixel shown in FIG. 12. In FIG. 13, it is assumed that the ith third scan line S3i is set to the (i-1)th first scan line S1i-1, and the ith fourth scan line S4i is set to the ith first scan line S1i.

Referring to FIG. 13, the light emitting control signal may be supplied to the ith light emitting control line Ei. When the light emitting control signal is supplied to the ith light emitting control line Ei, the sixteenth transistor M16 and the seventeenth transistor M17 may be turned off.

When the sixteenth transistor M16 is turned off, the first driving power supply ELVDD and the eleventh node N11 may be electrically disconnected. When the seventeenth transistor M17 is turned off, the eleventh transistor M11 and the organic light emitting diode OLED may be electrically disconnected. Therefore, when the light emitting control signal is supplied to the ith light emitting line Ei, the pixel PXL may be set to a non-emission state.

After the light emitting control signal is supplied to the ith light emitting control line Ei, the third scan signal may be supplied to the ith third scan line S3i (i.e., the (i-1)th first scan line S1i-1). When the third scan signal is supplied to the ith third scan line S3i, the fourteenth transistor M14 may be turned on. When the fourteenth transistor M14 is turned on, the voltage of the first power supply Vint may be supplied to the twelfth node N12. The twelfth node N12 may be initialized to the voltage of the first power supply Vint.

After the twelfth node N12 is initialized to the voltage of the first power supply Vint, the first scan signal may be supplied to an ith first scan line S1i, the second scan signal may be supplied to the ith second scan line S2i, and the fourth scan signal may be supplied to the ith fourth scan line S4i. The ith fourth scan line S4i may be set to the ith first scan line S1i.

When the fourth scan signal is supplied to the ith fourth scan line S4i, the fifteenth transistor M15 may be turned on. When the fifteenth transistor M15 is turned on, the voltage of the first power supply Vint may be supplied to the anode electrode of the organic light emitting diode OLED. When the voltage of the first power supply Vint is supplied to the anode electrode of the organic light emitting diode OLED, the organic capacitor Coled may be discharged, thereby enhancing the black expression capability.

When the second scan signal is supplied to the ith second scan line S2i, the auxiliary transistor MS11 may be turned on. When the auxiliary transistor MS11 is turned on, the second electrode of the eleventh transistor M11 and the thirteenth transistor M13 may be electrically connected.

When the first scan signal is supplied to the ith first scan signal S1i, the twelfth transistor M12 and the thirteenth transistor M13 may be turned on.

When the thirteenth transistor M13 is turned on, the auxiliary transistor MS11 and the twelfth node N12 may be electrically connected. Since the auxiliary transistor MS11 is set to a turn-on state, the twelfth node N12 and the second electrode of the first transistor M11 may be electrically connected to each other, so that the eleventh transistor M11 may be connected in a diode form.

When the twelfth transistor M12 is turned on, a data signal from the data line Dm may be supplied to the eleventh node N11. The eleventh transistor M11 may be turned on since the twelfth node N12 is initialized to the voltage of the first power supply Vint lower than the data signal.

When the eleventh transistor M11 is turned on, the data signal supplied to the eleventh node N11 may be supplied to the twelfth node N12 via the auxiliary transistor MS11 and the eleventh transistor M11 connected in the diode form. The voltage corresponding to the data signal and the threshold voltage of the eleventh transistor M11 may be applied to the twelfth node N12. The voltage corresponding to the data signal and the threshold voltage of the eleventh transistor M11 may be stored in the storage capacitor Cst.

After a predetermined voltage is charged in the storage capacitor Cst, the supply of the first scan signal to the ith first scan line S1i may be stopped, so that the thirteenth transistor M13 and the fifteenth transistor M15 may be turned off accordingly.

After the thirteenth transistor M13 is turned off, the supply of the second scan signal to the ith second scan line S2i may be stopped. When the supply of the second scan signal to the ith second scan line S2i is stopped, the auxiliary transistor MS11 may be turned off. Since the thirteen transistor M13 is set to a turn-off state, the voltage of the twelfth node N12 may be prevented from being changed by a channel capacitor of the auxiliary transistor MS11 formed of an oxide semiconductor transistor.

Thereafter, the supply of the light emitting control signal to the ith light emitting control line Ei may be stopped. When the supply of the light emitting control signal to the ith light emitting control line Ei is stopped, the sixteenth transistor M16 and the seventeenth transistor M17 may be turned on.

When the sixteenth transistor M16 is turned on, the first driving power supply ELVDD and the eleventh node N11 may be electrically connected. When the seventeenth transistor M17 is turned on, the second electrode of the eleventh transistor M11 may be electrically connected to the anode electrode of the organic light emitting diode OLED. The eleventh transistor M11 may control the amount of current flowing from the first driving power supply ELVDD to the second driving power supply ELVSS via the organic light emitting diode OLED in response to a voltage applied to the twelfth node N12.

As described above, the pixel PXL according to another embodiment of the present disclosure may generate light of a predetermined luminance by repeating the above-described period. In addition, since the auxiliary transistor MS11 formed of the oxide semiconductor transistor is turned off during a period in which the organic light emitting diode OLED emits light, the leakage current from the twelfth node N12 may be minimized, so that the pixel PXL may generate light of a desired luminance.

Figure 14:
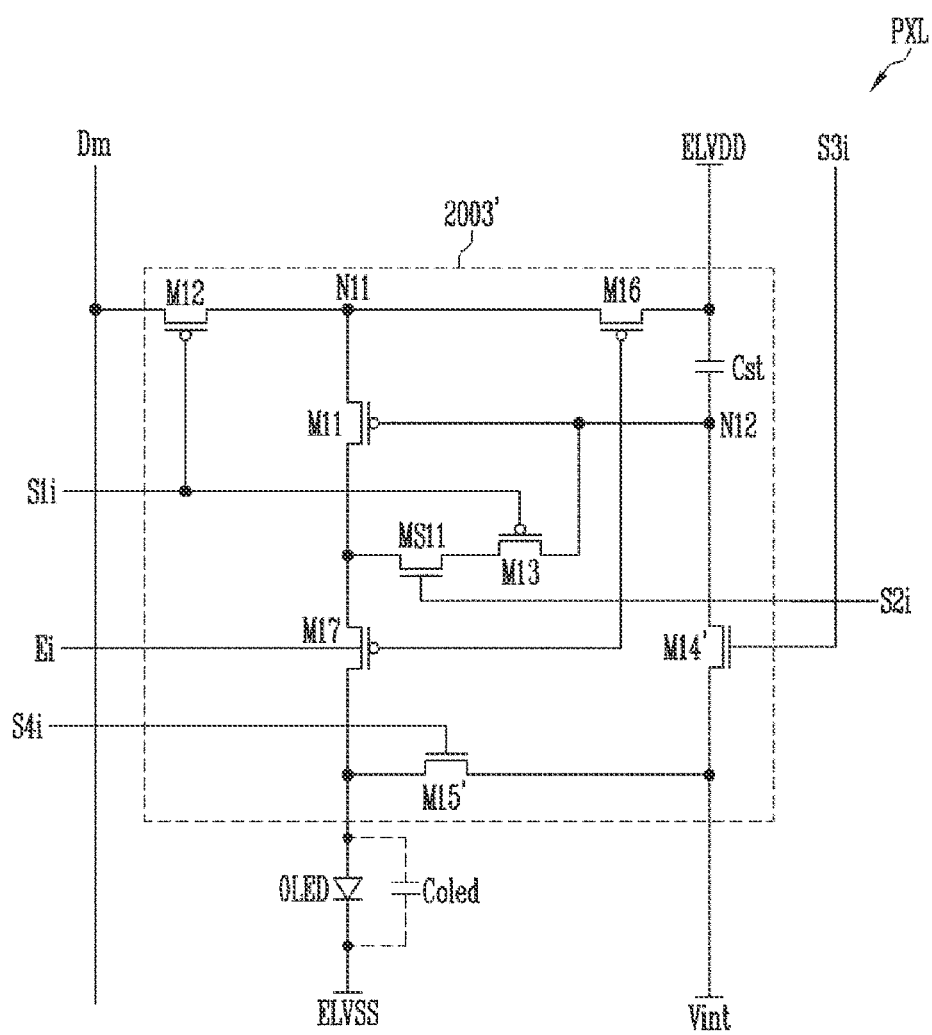
FIG. 14 is a view illustrating a pixel according to another embodiment of the present disclosure.

FIG. 14 is a view illustrating the pixel PXL according to another embodiment of the present disclosure. In the description of FIG. 14, the same reference numerals will be given to the same constituents as those of FIG. 12, and a detailed description thereof will be omitted.

Referring to FIG. 14, the pixel PXL according to another embodiment of the present disclosure may include the organic light emitting diode OLED, and a pixel circuit 2003' controlling the amount of current supplied to the organic light emitting diode OLED.

The anode electrode of the organic light emitting diode OLED may be connected to the pixel circuit 2003', and the cathode electrode thereof may be connected to the second driving power supply ELVSS. The organic light emitting diode OLED may generate light of a predetermined luminance corresponding to the amount of current supplied from the pixel circuit 2003'.

The pixel circuit 2003' may control the amount of current flowing from the first driving power supply ELVDD to the second driving power supply ELVSS via the organic light emitting diode OLED in response to a data signal. The pixel circuit 2003' may include the eleventh transistor M11, the twelfth transistor M12, the thirteenth transistor M13, a fourteenth transistor M14', a fifteenth transistor M15', the sixteenth transistor M16, the seventeenth transistor M17, the auxiliary transistor MS11, and the storage capacitor Cst.

The fourteenth transistor M14' may be connected between the twelfth node N12 and the first power supply Vint. In addition, a gate electrode of the fourteenth transistor M14' may be connected to the ith third scan line S3i. The fourteenth transistor M14' may be turned on when a third scan signal is supplied to the ith third scan line S3i to supply a voltage of the first power supply Vint to the twelfth node N12.

The fourteenth transistor M14' may be formed of an N-type oxide semiconductor transistor. When the fourteenth transistor M14' is formed of the N-type oxide semiconductor transistor, the leakage current flowing from the twelfth node N12 to the first power supply Vint may be minimized, so that the pixel PXL may realize desired luminance. In addition, since the fourteenth transistor M14' is formed of an N-type transistor, the ith third scan line S3i may be set to an (i-1)th second scan line S2i-1.

The fifteenth transistor M15' may be connected between the anode electrode of the organic light emitting diode OLED and the first power supply Vint. In addition, a gate electrode of the fifteenth transistor M15' may be connected to the ith fourth scan line S4i. The fifteenth transistor M15' may be turned on when a fourth scan signal is supplied to the ith fourth scan line S4i to supply the voltage of the first power supply Vint to the anode electrode of the organic light emitting diode OLED.

The fifteenth transistor M15' may be formed of an N-type oxide semiconductor transistor. When the fifteenth transistor M15' is formed of the N-type oxide semiconductor transistor, the leakage current between the anode electrode of the organic light emitting diode OLED and the first power supply Vint may be minimized, so that desired luminance may be realized by the pixel PXL. In addition, since the fifteenth transistor M15' is formed of an N-type transistor, the ith fourth scan line S4i may be set to the ith second scan S2i.

Figure 15:
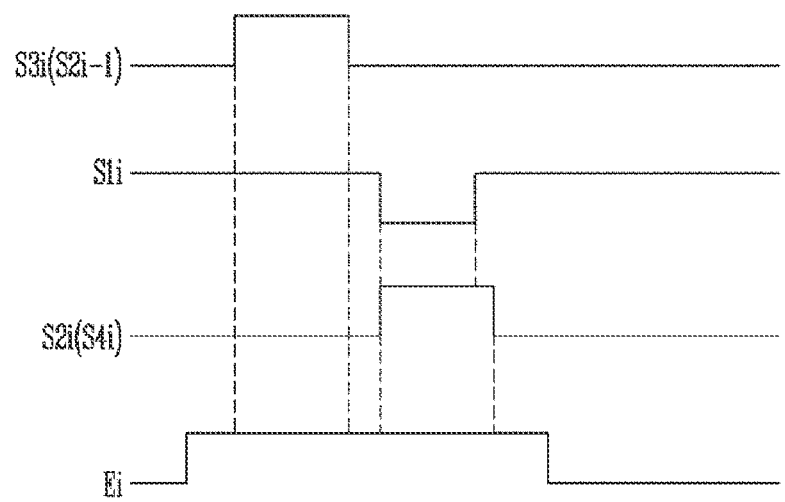
FIG. 15 is a waveform view showing an embodiment of a driving method of the pixel shown in FIG. 14.

FIG. 15 is a waveform view showing an embodiment of a driving method of the pixel shown in FIG. 14. In FIG. 15, it is assumed that the ith third scan line S3i is set to the (i-1)th second scan line S2i-1, and the ith four scan line S4i may be set to the ith second scan line S2i.

Referring to FIG. 15, the light emitting control signal may be supplied to the ith light emitting control line Ei. When a light emitting control signal is supplied to the ith light emitting control line Ei, the sixteenth transistor M16 and the seventeenth transistor M17 may be turned off, and the pixel PXL may be to a non-emission state accordingly.

After the light emitting control signal is supplied to the ith light emitting control line Ei, the ith third scan signal may be supplied to the ith third scan line S3i (i.e., the (i-1)th second scan line S2i-1). When a third scan signal is supplied to the ith third scan line S3i, the fourteenth transistor M14' may be turned on. When the fourteenth transistor M14' is turned on, the voltage of the first power supply Vint may be supplied to the twelfth node N12. The twelfth node N12 may be initialized to the voltage of the first power supply Vint.

After the twelfth node N12 is initialized to the voltage of the first power supply Vint, a first scan signal may be supplied to the ith first scan signal S1i, a second scan signal may be supplied to the ith second scan line S2i, and a fourth scan signal may be supplied to the ith fourth scan line S4i. The ith fourth scan line S4i may be set to the ith second scan line S2i.

When the fourth scan signal is supplied to the ith fourth scan line S4i, the fifteenth transistor M15' may be turned on. When the fifteenth transistor M15' is turned on, the voltage of the first power supply Vint may be supplied to the anode electrode of the organic light emitting diode OLED. When the voltage of the first power supply Vint is supplied to the anode electrode of the organic light emitting diode OLED, the organic capacitor Coled may be discharged, thereby enhancing the black expression capability.

When the second scan signal is supplied to the ith second scan line S2i, the auxiliary transistor MS11 may be turned on. When the auxiliary transistor MS11 is turned on, the second electrode of the eleventh transistor M11 and the thirteenth transistor M13 may be electrically connected.

When the first scan signal is supplied to the ith first scan line S1i, the twelfth transistor M12 and the thirteenth transistor M13 may be turned on.

When the thirteenth transistor M13 is turned on, the auxiliary transistor MS11 and the twelfth node N12 may be electrically connected. Since the auxiliary transistor MS11 is set to a turn-on state, the twelfth node N12 and the second electrode of the first transistor M11 may be electrically connected to each other, so that the eleventh transistor M11 may be connected in a diode form.

When the twelfth transistor M12 is turned on, the data signal from the data line Dm may be supplied to the eleventh node N11. The eleventh transistor M11 may be turned on since the twelfth node N12 is initialized to the voltage of the first power supply Vint lower than the data signal.

When the eleventh transistor M11 is turned on, the data signal supplied to the eleventh node N11 may be supplied to the twelfth node N12 via the auxiliary transistor MS11 and the eleventh transistor M11 connected in the diode form. The voltage corresponding to the data signal and the threshold voltage of the eleventh transistor M11 may be applied to the twelfth node N12. The voltage corresponding to the data signal and the threshold voltage of the eleventh transistor M11 may be stored in the storage capacitor Cst.

After a predetermined voltage is charged in the storage capacitor Cst, the supply of the first scan signal to the ith first scan line S1i may be stopped, and the thirteenth transistor M13 may be turned off accordingly.

After the thirteenth transistor M13 is turned off, the supply of the second scan signal to the ith second scan line S2i may be stopped. When the supply of the second scan signal to the ith second scan line S2i is stopped, the auxiliary transistor MS11 may be turned off. Since the thirteenth transistor M13 is set to a turn-off state, the voltage of the twelfth node N12 may be prevented from being changed by the channel capacitor of the auxiliary transistor MS11 formed of an oxide semiconductor transistor.

Thereafter, the supply of the light emitting control signal to the ith light emitting control line Ei may be stopped. When the supply of the light emitting control signal to the ith light emitting control line Ei is stopped, the sixteenth transistor M16 and the seventeenth transistor M17 may be turned on.

When the sixteenth transistor M16 is turned on, the first driving power supply ELVDD and the eleventh node N11 may be electrically connected. When the seventeenth transistor M17 is turned on, the second electrode of the eleventh transistor M1 may be electrically connected to the anode electrode of the organic light emitting diode OLED. The eleventh transistor M11 may control the amount of current flowing from the first driving power supply ELVDD to the second driving power supply ELVSS via the organic light emitting diode OLED in response to the voltage applied to the twelfth node N12.

As described above, the pixel PXL according to another embodiment of the present disclosure may generate light of a predetermined luminance by repeating the above-described period. Since the auxiliary transistor MS11 and the fourteenth transistor M14' connected to the twelfth node N12 are formed of oxide semiconductor transistors, the leakage current from the twelfth node N12 may be minimized. In addition, since the fifteenth transistor M15' connected between the first power supply Vint and the anode electrode of the organic light emitting diode OLED is formed of an oxide semiconductor transistor, the leakage current between the organic light emitting diode OLED and the first power supply Vint may be minimized.

Figure 16:
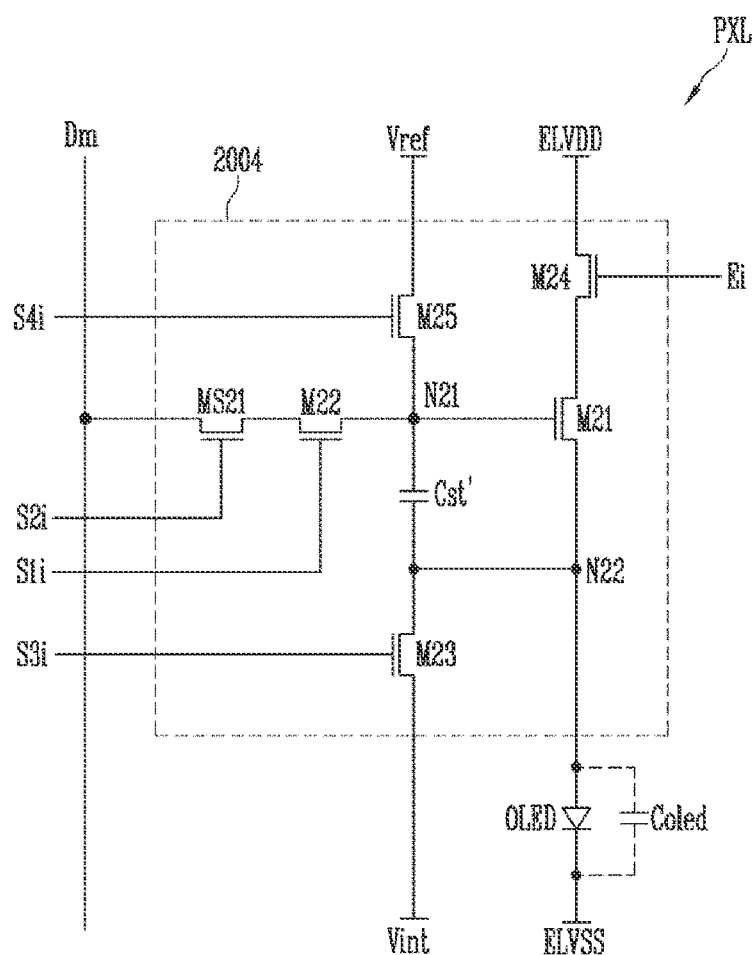
FIG. 16 is a view illustrating a pixel according to another embodiment of the present disclosure.

FIG. 16 is a view illustrating the pixel PXL according to another embodiment of the present disclosure. For convenience of explanation, FIG. 16 shows the pixel PXL disposed on the ith horizontal line and connected to the mth data line Dm.

Referring to FIG. 16, the pixel PXL according to another embodiment of the present disclosure may include a pixel circuit 2004 and the organic light emitting diode OLED.

The anode electrode of the organic light emitting diode OLED may be connected to the pixel circuit 2004, and the cathode electrode thereof may be connected to the second driving power supply ELVSS. The organic light emitting diode OLED may generate light of a predetermined luminance corresponding to the amount of current supplied from the pixel circuit 2004.

The pixel circuit 2004 may include a $21^{st}$ transistor M21, a $22^{nd}$ transistor M22, a $23^{rd}$ transistor M23, a $24^{th}$ transistor M24, a $25^{th}$ transistor M25, an auxiliary transistor MS21, and the storage capacitor Cst'.

A first electrode of the $21^{st}$ transistor M21 may be connected to a second electrode of the $24^{th}$ transistor M24 and a second electrode of the $21^{st}$ transistor M21 may be connected to a $22^{nd}$ node N22 in which the anode electrode of the organic light emitting diode OLED is connected. In addition, a gate electrode of the $21^{21}$ transistor M21 may be connected to a $21^{st}$ node N21. The $21^{st}$ transistor M21 may control the amount of current flowing from the first driving power supply ELVDD to the second driving power supply ELVSS via the organic light emitting diode OLED in response to a voltage of the $21^{st}$ node N21. In order to ensure a fast driving speed, the $21^{st}$ transistor M21 may be formed of an N-type polysilicon semiconductor transistor.

The $22^{nd}$ transistor M22 may be connected between the auxiliary transistor MS21 and the $21^{st}$ node N21. In addition, a gate electrode of the $22^{nd}$ transistor M22 may be connected to the ith first scan line S1i. The $22^{nd}$ transistor M22 may be turned on when a first scan signal is supplied to the ith first scan line S1i. When the $22^{nd}$ transistor M22 is turned on, the auxiliary transistor MS21 and the $21^{st}$ node N21 may be electrically connected. The $22^{nd}$ transistor M22 may be formed of an N-type polysilicon semiconductor transistor to ensure a fast driving speed.

The auxiliary transistor MS21 may be connected between the data line Dm and the $22^{nd}$ transistor M22. In addition, a gate electrode of the auxiliary transistor MS21 may be connected to the ith second scan line S2i. The auxiliary transistor MS21 may be turned on when a scan signal is supplied to the ith second scan line S2i to electrically connect the data line Dm and the $22^{nd}$ transistor M22. The auxiliary transistor MS21 may be formed of an oxide semiconductor transistor. When the auxiliary transistor MS21 is formed of the oxide semiconductor transistor, the voltage of the $21^{st}$ node N21 may be prevented from being changed due to a leakage current, thereby displaying an image of a desired luminance.

The $23^{rd}$ transistor M23 may be connected between the $22^{nd}$ node N22 and the first power supply Vint. In addition, a gate electrode of the $23^{rd}$ transistor M23 may be connected to the ith third scan line S3i. The $23^{rd}$ transistor M23 may be turned on when the third scan signal is supplied to the ith third scan line S3i. When the $23^{rd}$ transistor M23 is turned on, the voltage of the initialization power supply Vint may be supplied to the $22^{nd}$ node N22. In order to secure the fast driving speed, the $23^{rd}$ transistor M23 may be formed of an N-type polysilicon semiconductor transistor.

The $24^{th}$ transistor M24 may be connected between the first driving power supply ELVDD and the first electrode of the $21^{st}$ transistor M21. In addition, a gate electrode of the $24^{th}$ transistor M24 may be connected to the ith light emitting control line Ei. The $24^{th}$ transistor M24 may be turned off when a light emitting control signal is supplied to the ith light emitting control line Ei and turned on when the light emitting control signal is not supplied. In order to ensure the fast driving speed, the $24^{th}$ transistor M24 may be formed of an N-type polysilicon semiconductor transistor.

The $25^{th}$ transistor M25 may be connected between a reference power supply Vref and the $21^{st}$ node N21. In addition, a gate electrode of the $25^{th}$ transistor M25 may be connected to the ith fourth scan line S4i. The $25^{th}$ transistor M25 may turn on when a fourth scan signal is supplied to the ith fourth scan line S4i and supply a voltage of the reference power supply Vref to the $21^{st}$ node N21. The $25^{th}$ transistor M25 may be formed of an N-type oxide semiconductor transistor. When the 25$^{th}$ transistor M25 is formed of the N-type oxide semiconductor transistor, a leakage current between the reference power supply Vref and the 21$^{st}$ node N21 may be minimized.

Additionally, the reference power supply Vref may be set to a voltage by which the 21$^{st}$ transistor M21 is turned on. For example, a voltage Vref−Vint obtained by subtracting the voltage of the first power supply Vint from the voltage of the reference power supply Vref may be set to a higher voltage than a threshold voltage of the 21$^{st}$ transistor M21.

The storage capacitor Cst' may be connected between the 21$^{st}$ node N21 and the 22$^{nd}$ node N22. The storage capacitor Cst' may store a voltage corresponding to the data signal and the threshold voltage of the 21$^{st}$ transistor M21.

In the above-described embodiment of the present disclosure, the auxiliary transistor MS21 and the 25$^{th}$ transistor M25 may be formed of oxide semiconductor transistors. The leakage current from the 21$^{st}$ transistor M21 may be minimized, and thus an image of a desired luminance may be displayed.

Further, according to an embodiment of the present disclosure, the 24$^{th}$ and 21$^{st}$ transistors M24 and M21 disposed on the current supply path for supplying a current to the organic light emitting diode OLED may be formed of polysilicon semiconductor transistors. When the 24$^{th}$ and 21$^{st}$ transistors M24 and M21 disposed on the current supply path are formed of the polysilicon semiconductor transistors, a current may be stably supplied to the organic light emitting diode OLED due to the fast driving characteristic.

Figure 17:
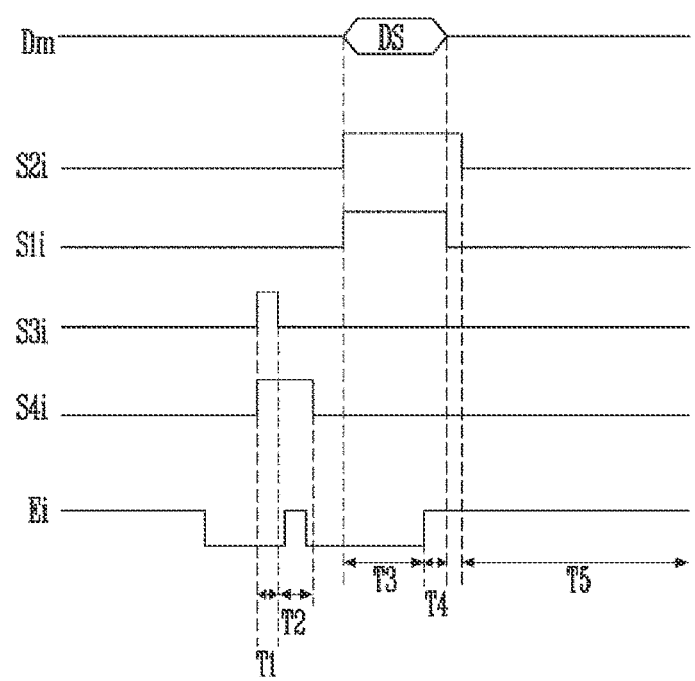
FIG. 17 is a waveform view showing an embodiment of a driving method of the pixel shown in FIG. 16.

FIG. 17 is a waveform view showing an embodiment of a driving method of the pixel PXL shown in FIG. 16.

Referring to FIG. 17, the light emitting control signal may be supplied to the ith light emitting control line Ei, so that the 24$^{th}$ transistor M24 may be turned off. When the 24$^{th}$ transistor M24 is turned off, the first driving power supply ELVDD and the 21$^{st}$ transistor M21 may be electrically disconnected, so that the pixel PXL may be set to a non-emission state.

In a first period T1, the third scan signal may be supplied to the ith third scan line S3i and the fourth scan signal S4i may be supplied to the ith fourth scan line S4i.

When the third scan signal is supplied to the ith third scan line S3i, the 23$^{rd}$ transistor M23 may be turned on. When the 23$^{rd}$ transistor M23 is turned on, the voltage of the first power supply Vint may be supplied to the 22$^{nd}$ node N22. The organic capacitor Coled may be discharged.

When the fourth scan signal is supplied to the ith fourth scan line S4i, the 25$^{th}$ transistor M25 may be turned on. When the 25$^{th}$ transistor M25 is turned on, the voltage of the reference power supply Vref may be supplied to the 21$^{st}$ node N21.

In a second period T2, the supply of the third scan signal may be stopped, so that the 23$^{rd}$ transistor M23 may be turned off. In addition, the supply of the light emitting control signal to the ith light emitting control line Ei may be stopped during a portion of the second period T2.

When the supply of the light emitting control signal to the ith light emitting control line Ei is stopped, the 24$^{th}$ transistor M24 may be turned on. When the 24$^{th}$ transistor M24 is turned on, the voltage of the first driving power supply ELVDD may be supplied to the first electrode of the 21$^{st}$ transistor M21. When the voltage of the first driving power supply ELVDD is supplied to the first electrode of the 21$^{st}$ transistor M21, because the 21$^{st}$ transistor M21 is turned on, thereby current flows through the 21$^{st}$ transistor M21, thus increasing the voltage of the 22$^{nd}$ node N22.

Since the 21$^{st}$ node N21 maintains the voltage of the reference power supply Vref, the 22$^{nd}$ node N22 may increase to the voltage obtained by subtracting the threshold voltage of the 21$^{st}$ transistor M21 from the reference power supply Vref. Therefore, the threshold voltage of the 21$^{st}$ transistor M21 may be stored in the storage capacitor Cst'.

After the second period T2, the supply of the fourth scan signal to the ith fourth scan line S4i may be stopped. When the supply of the fourth scan signal to the ith fourth scan line S4i is stopped, the 25$^{th}$ transistor M25 may be turned off.

In a third period T3, the first scan signal may be supplied to the ith first scan line S1i and the second scan signal may be supplied to the ith second scan line S2i. When the first scan signal is supplied to the ith first scan line S1i, the 22$^{nd}$ transistor M22 may be turned on. When the second scan signal is supplied to the ith second scan line S2i, the auxiliary transistor MS21 may be turned on. When the 22$^{nd}$ transistor M22 and the auxiliary transistor MS21 are turned on, the data line Dm and the 21$^{st}$ node N21 may be electrically connected. A data signal DS from the data line Dm may be supplied to the 21$^{st}$ node N21.

The data signal DS supplied to the 21$^{st}$ node N21 may be stored in the storage capacitor Cst'. That is, a voltage corresponding to the data signal DS and the threshold voltage of the 21$^{st}$ transistor M21 may be stored in the storage capacitor Cst' during the second period T2 and the third period T3.

In a fourth period T4, the supply of the light emitting control signal to the ith light emitting control line Ei may be stopped. When the supply of the light emitting control signal to the ith light emitting control line Ei is stopped, the 24$^{th}$ transistor M24 may be turned on.

When the 24$^{th}$ transistor M24 is turned on, the first driving power supply ELVDD and the 21$^{st}$ transistor M21 may be electrically connected. The 21$^{st}$ transistor M21 may be turned on and a predetermined current may flow into the 22$^{nd}$ node N22. The current flowing from the 21$^{st}$ transistor M21 may be stored in a capacitance C=Cst'+Coled, which is a coupling capacitor of the storage capacitor Cst' and the organic capacitor Coled, and thus the voltage of the 22$^{nd}$ node N22 may increase. A voltage rise of the 22$^{nd}$ node N22 may be differently set for each pixel PXL corresponding to mobility of the 21$^{st}$ transistor M21, and the mobility of the 21$^{st}$ transistor M21 may be compensated accordingly. A time allocated to the fourth period T4 may be experimentally determined so that the mobility of the 21$^{st}$ transistor M21 may be compensated.

After the fourth period T4, the supply of the first scan signal to the ith first scan line S1i may be stopped, and the 22$^{nd}$ transistor M22 may be turned off accordingly. After the 22$^{nd}$ transistor M22 is turned off, the supply of the second scan signal to the ith second scan line S2i may be stopped, and the auxiliary transistor MS21 may be turned off accordingly. Since the 22$^{nd}$ transistor M22 is set to a turn-off state, the voltage of the 21$^{st}$ node N21 may be prevented from being changed by a channel capacitor of the auxiliary transistor MS21 formed of an oxide semiconductor transistor.

In a fifth period T5, the 21$^{st}$ transistor M21 may control the amount of current flowing from the first driving power supply ELVDD to the second driving power supply ELVSS via the organic light emitting diode OLED in response to the voltage of the 21$^{st}$ node N21. The organic light emitting diode OLED may generate light of a predetermined luminance corresponding to the current amount.

Figure 18:
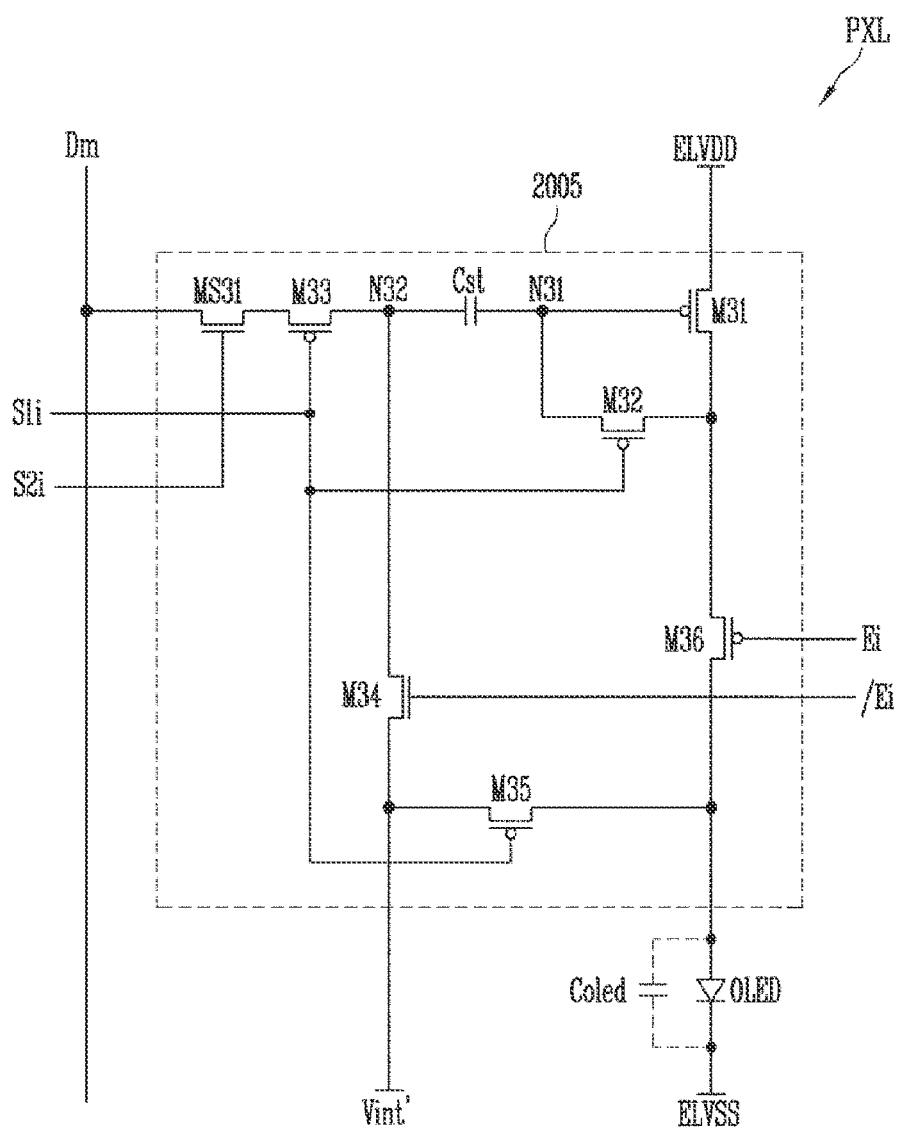
FIG. 18 is a view illustrating a pixel according to another embodiment of the present disclosure.

FIG. 18 is a view illustrating a pixel according to another embodiment of the present disclosure. For convenience of explanation, FIG. 18 shows the pixel PXL disposed on the ith horizontal line and connected to the mth data line Dm.

Referring to FIG. 18, the pixel PXL according to an embodiment of the present disclosure may include the organic light emitting diode OLED and a pixel circuit 2005.

The anode electrode of the organic light emitting diode OLED may be connected to the pixel circuit 2005, and the cathode electrode thereof may be connected to the second driving power supply ELVSS. The organic light emitting diode OLED may generate light of a predetermined luminance corresponding to the amount of current supplied from the pixel circuit 2005.

The pixel circuit 2005 may control the amount of current flowing from the first driving power supply ELVDD to the second driving power supply ELVSS via the organic light emitting diode OLED in response to the data signal. The pixel circuit 2005 may include a $31^{st}$ transistor M31, a $32^{nd}$ transistor M32, a $33^{rd}$ transistor M33, a $34^{th}$ transistor M34, a $35^{th}$ transistor M35, and a $36^{th}$ transistor M36, an auxiliary transistor MS31, and the storage capacitor Cst.

A first electrode of the $31^{st}$ transistor M31 may be connected to the first driving power supply ELVDD, and a second electrode thereof may be connected to the anode electrode of the organic light emitting diode OLED via the $36^{th}$ transistor M36. In addition, a gate electrode of the $31^{st}$ transistor M31 may be connected to a $31^{st}$ node N31. The $31^{st}$ transistor M31 may control the amount of current supplied from the first driving power supply ELVDD to the second driving power supply ELVSS via the organic light emitting diode OLED in response to a voltage of the $31^{st}$ node N31. In order to ensure a fast driving speed, the $31^{st}$ transistor M31 may be formed of a P-type polysilicon semiconductor transistor.

The $32^{nd}$ transistor M32 may be connected between the $31^{st}$ node N31 and a second electrode of the $31^{st}$ transistor M31. In addition, a gate electrode of the $32^{nd}$ transistor M32 may be connected to the ith first scan line S1i. The $32^{nd}$ transistor M32 may be turned on when a first scan signal is supplied to the ith first scan line S1i. When the $32^{nd}$ transistor M32 is turned on, the $31^{st}$ transistor M31 may be connected in a diode form. The $32^{nd}$ transistor M32 may be formed of a P-type polysilicon semiconductor transistor for securing a fast driving speed.

The $33^{rd}$ transistor M33 may be connected between the auxiliary transistor MS31 and a $32^{nd}$ node N32. In addition, a gate electrode of the $33^{rd}$ transistor M33 may be connected to the ith first scan line S1i. The third transistor M33 may be turned on when the first scan signal is supplied to the ith first scan line S1i. When the $33^{rd}$ transistor M33 is turned on, the auxiliary transistor MS31 and the $32^{nd}$ node N32 may be electrically connected. The third transistor M33 may be formed of a P-type polysilicon semiconductor transistor in order to secure the fast driving speed.

The auxiliary transistor MS31 may be connected between the data line Dm and the $33^{rd}$ transistor M33. In addition, a gate electrode of the auxiliary transistor MS31 may be connected to the ith second scan line S2i. The auxiliary transistor MS31 may be turned on when the scan signal is supplied to the ith second scan line S2i to electrically connect the data line Dm and the $33^{rd}$ transistor M33. The auxiliary transistor MS31 may be formed of an oxide semiconductor transistor. When the auxiliary transistor MS31 is formed of the oxide semiconductor transistor, a voltage of the $32^{nd}$ node N32 may be prevented from being changed due to a leakage current, thereby displaying an image of a desired luminance.

The $34^{th}$ transistor M34 may be connected between the $32^{nd}$ node N32 and a first power supply Vint'. In addition, a gate electrode of the $34^{th}$ transistor M34 may be connected to an ith inverted light emitting control line/Ei. The $34^{th}$ transistor M34 may be turned off when an inverted light emitting control signal is supplied to the ith inverted light emitting control line/Ei and turned on when the inverted light emitting control signal is not supplied. When the $34^{th}$ transistor M34 is turned on, a voltage of the first power supply Vint' may be supplied to the $32^{nd}$ node N32. The $34^{th}$ transistor M34 may be formed of an oxide semiconductor transistor so that the leakage current from the $32^{nd}$ node N32 may be minimized.

In addition, the inverted light emitting control signal supplied to the ith inverted light emitting control line/Ei may be set to a signal obtained by inverting the light emitting control signal supplied to the ith light emitting control line Ei. For example, when the light emitting control signal is set to a high voltage, the inverted light emitting control signal may be set to a low voltage.

The $35^{t}$h transistor M35 may be connected between the anode electrode of the organic light emitting diode OLED and the first power supply Vint'. In addition, a gate electrode of the $35^{th}$ transistor M35 may be connected to the ith first scan line S1i. The $35^{th}$ transistor M35 may be turned on when the first scan signal is supplied to the ith first scan line S1i. When the $35^{th}$ transistor M35 is turned on, the voltage of the first power supply Vint' may be supplied to the anode electrode of the organic light emitting diode OLED. The $35^{th}$ transistor M35 may be formed of a P-type polysilicon semiconductor transistor.

The $36^{th}$ transistor M36 may be connected between the second electrode of the $31^{st}$ transistor M31 and the anode electrode of the organic light emitting diode OLED. In addition, a gate electrode of the $36^{th}$ transistor M36 may be connected to the ith light emitting control line Ei. The $36^{th}$ transistor M36 may be turned off when the light emitting control signal is supplied to the ith light emitting control line Ei and turned on when the light emitting control signal is not supplied. The $36^{th}$ transistor M36 may be formed of a P-type polysilicon semiconductor transistor.

The storage capacitor Cst may be connected between the $31^{st}$ node N31 and the $32^{nd}$ node N32. The storage capacitor Cst may store a voltage corresponding to the data signal and a threshold voltage of the 31st transistor M31.

According to another embodiment of the present disclosure described above, the $31^{st}$ auxiliary transistor MS31 and $34^{th}$ transistor M34 may be formed of oxide semiconductor transistors. When the $31^{st}$ auxiliary transistor MS31 and $34^{th}$ transistor M34 are formed of the oxide semiconductor transistors, a voltage variation of the $32^{nd}$ node N32 due to a leakage current may be minimized, thereby displaying an image of a desired luminance.

Further, in another embodiment of the present disclosure described above, the $31^{st}$ and $36^{th}$ transistors M31 and M36 disposed on the current supply path for supplying a current to the organic light emitting diode OLED may be formed of polysilicon semiconductor transistors. When the $31^{st}$ and $36^{th}$ transistors M31 and M36 disposed on the current supply path are formed of the polysilicon semiconductor transistors, a current may be stably supplied to the organic light emitting diode OLED due to a fast driving characteristic.

Figure 19:
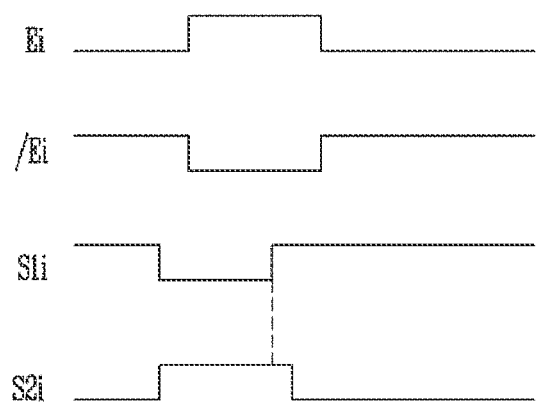
FIG. 19 is a waveform view showing an embodiment of a driving method of the pixel shown in FIG. 18.

FIG. 19 is a waveform view showing an embodiment of a driving method of the pixel PXL shown in FIG. 18.

Referring to FIG. 19, the first scan signal may be supplied to the ith first scan line S1i, and the second scan signal may be supplied to the ith second scan line S2i.

When the first scan signal is supplied to the ith first scan line S1$i$, the 32$^{nd}$ transistor M32, the 33$^{rd}$ transistor M33, and the 35$^{th}$ transistor M35 may be turned on.

When the 35$^{th}$ transistor M35 is turned on, the voltage of the first power supply Vint' may be supplied to the anode electrode of the organic light emitting diode OLED.

When the 32$^{nd}$ transistor M32 is turned on, the 31$^{st}$ transistor M31 may be connected in a diode form. The 31$^{st}$ node N31 may be electrically connected to the first power supply Vint' via the 36$^{th}$ transistor M36 and the 35$^{th}$ transistor M35. The 31$^{st}$ node N31 may be initialized to the voltage of the first power supply Vint'.

When the 33$^{rd}$ transistor M33 is turned on, the 32$^{nd}$ node N32 and the 31$^{st}$ auxiliary transistor MS31 may be electrically connected.

When the second scan signal is supplied to the ith second scan line S2$i$, the 31$^{st}$ auxiliary transistor MS31 may be turned on. When the 31$^{st}$ auxiliary transistor MS31 is turned on, the data line Dm and the 32$^{nd}$ node N32 may be electrically connected.

The light emitting control signal may be supplied to the ith light emitting control line Ei so as to partially overlap the first and second scan lines, and the inverted light emitting control signal may be supplied to the ith inverted light emitting control line/Ei.

When the light emitting control signal is supplied to the ith light emitting control line Ei, the 36$^{th}$ transistor M36 may be turned off. When the 36$^{th}$ transistor M36 is turned off, a voltage obtained by subtracting an absolute value of the threshold voltage of the 31$^{st}$ transistor M31 from the first driving power supply ELVDD may be applied to the 31$^{st}$ node N31 by the 31$^{st}$ transistor M31 connected in a diode form.

When the inverted light emitting control signal is supplied to the ith inverted light emitting control line/Ei, the 34$^{th}$ transistor M34 may be turned off. When the 34$^{th}$ transistor is turned off, an electrical connection between the 32$^{nd}$ node N32 and the first power supply Vint' may be disconnected. The voltage of the data signal may be applied to the 32$^{nd}$ node N32 since the 31$^{st}$ auxiliary transistor MS31 and the 33$^{rd}$ transistor M33 maintain a turn-on state.

Therefore, a voltage corresponding to a voltage difference between the 32$^{nd}$ node N32 and the 31$^{st}$ node N31 may be charged in the storage capacitor Cst. That is, a voltage corresponding to the data signal and the threshold voltage of the 31$^{st}$ transistor M31 may be stored in the storage capacitor Cst.

After a predetermined voltage is charged in the storage capacitor Cst, the supply of the first scan signal to the ith first scan line S1$i$ may be stopped. When the supply of the first scan signal to the ith first scan line S1$i$ is stopped, the 32$^{nd}$ transistor M32, the 33$^{rd}$ transistor M33, and the 35$^{th}$ transistor M35 may be turned off.

The supply of the second scan signal to the ith second scan line S2$i$ may be stopped after the supply of the first scan signal to the ith first scan line S1$i$ is stopped. When the supply of the second scan signal to the ith second scan line S2$i$ is stopped, the auxiliary transistor MS31 may be turned off. Since the 33$^{rd}$ transistor M33 maintains a turn-off state, a voltage of the 32$^{nd}$ node N32 may be prevented from being changed by a kick-back voltage of the auxiliary transistor MS31.

The supply of the light emitting control signal to the ith light emitting control line Ei may be stopped, and the supply of the inverted light emitting control signal to the ith inverted light emitting control line/Ei may be stopped. When the supply of the light emitting control signal to the ith light emitting control line Ei is stopped, the 36$^{th}$ transistor M36 may be turned on. When the 36$^{th}$ transistor M36 is turned on, the 31$^{st}$ transistor M31 and the organic light emitting diode OLED may be electrically connected.

When the supply of the inverted light emitting control signal to the ith inverted light emitting control line/Ei is stopped, the voltage of the first power supply Vint' may be supplied to the 32$^{nd}$ node N32. The voltage of the first power supply Vint' may be set to a specific voltage within the voltage range of the data signal.

When the black data signal is applied to the 32$^{nd}$ node N32, the voltage of the 32$^{nd}$ node N32 may remain constant or be increased by a predetermined voltage when the voltage of the first power supply Vint' is supplied. The voltage of the 31$^{st}$ node N31 may be increased by a predetermined voltage corresponding to the voltage change of the 32$^{nd}$ node N32 or maintain the voltage of the previous period. For example, the 31$^{st}$ node N31 may be maintained at the voltage obtained by subtracting the absolute value of the threshold voltage of the 31$^{st}$ transistor M31 from the first driving power supply ELVSS. The 31$^{st}$ transistor M31 may maintain a turn-off state.

When a data signal corresponding to a grayscale, except for a black grayscale, is applied to the 32$^{nd}$ node N32, the voltage of the 32$^{nd}$ node N32 may be reduced by a predetermined voltage when the voltage of the first power supply Vint' is supplied. The voltage of the 31th node N31 may be reduced by the predetermined voltage corresponding to the voltage change of the 32$^{nd}$ node N32. When the voltage of the 31$^{st}$ node N31 is reduced, the 31$^{st}$ transistor M31 may be turned on. The 31$^{st}$ transistor M31 may supply a current corresponding to the 31$^{st}$ node N31 to the organic light emitting diode OLED.

A voltage drop of the 32$^{nd}$ node N32 may be determined by the data signal. That is, a voltage drop of the 31$^{st}$ node N31 may be determined by the data signal, and the 31$^{st}$ transistor M31 may control the amount of current corresponding to the data signal.

According to a pixel and an organic light emitting display device having the same according to an embodiment of the present disclosure, an oxide semiconductor transistor may be formed on a leakage current path to reduce a leakage current, so that a desired image may be displayed. Specifically, according to an embodiment of the present disclosure, a polysilicon semiconductor transistor may be formed so as to be connected to an oxide semiconductor transistor. The polysilicon semiconductor transistor may be turned off before the oxide semiconductor transistor, so that a voltage of a gate electrode of a driving transistor may be prevented from being changed by a kick-back voltage of the oxide semiconductor transistor.

While the present disclosure has been particularly shown and described with reference to exemplary embodiments thereof, it is to be understood that the disclosure is not limited to the disclosed exemplary embodiments. In addition, it will be understood by those of skill in the art that various changes in form and details may be made without departing from the spirit and scope of the disclosure as set forth in the following claims.

The scope of the present disclosure should not be limited to the details described in the detailed description of the specification, but should be defined by the claims. In addition, all changes or modifications derived from the meaning and scope of the claims and their equivalents should be construed as being included within the scope of the present disclosure.

What is claimed is:

1. A pixel, comprising:
a light emitting diode;
a first transistor including a gate electrode connected to a first node, the first transistor electrically connecting a first driving power supply and a second node connected to an anode electrode of the light emitting diode;
a second transistor electrically connecting a data line and the first node;
an auxiliary transistor connected between the data line and the second transistor;
a capacitor connected between the first node and the second node;
a third transistor electrically connecting a first power supply and the second node;
a fourth transistor electrically connecting the first driving power supply and the first transistor; and
a fifth transistor electrically connecting a reference power supply and the first node,
wherein the second transistor and the auxiliary transistor have a first overlapping turn-on period, and the second transistor is turned off before the auxiliary transistor is turned off.

2. The pixel of claim 1, wherein the second transistor includes polysilicon as an active layer, and wherein the auxiliary transistor includes an oxide semiconductor as an active layer.

3. The pixel of claim 2, wherein each of the first transistor, the third transistor, and the fourth transistor includes polysilicon as an active layer.

4. The pixel of claim 3, wherein the fifth transistor includes the oxide semiconductor as an active layer.

5. The pixel of claim 4, wherein the first transistor, the second transistor, the auxiliary transistor, the third transistor, the fourth transistor, and the fifth transistor are N-type transistors.

6. The pixel of claim 1, wherein a gate electrode of the second transistor is connected to a first scan line, a gate electrode of the auxiliary transistor is connected to a second scan line, a gate electrode of the third transistor is connected to a third scan line, and a gate electrode of the fifth transistor is connected to a fourth scan line.

7. The pixel of claim 6, wherein the first scan line, the second scan line, the third scan line, and the fourth scan line are different from each other.

8. The pixel of claim 7, wherein a gate electrode of the fourth transistor is connected to a light emitting control line.

9. The pixel of claim 8, wherein the third transistor and the fifth transistor have a second overlapping turn-on period and the third transistor is turned off before the fifth transistor is turned off.

10. The pixel of claim 9, wherein the second overlapping turn-on period is before the first overlapping turn-on period.

11. A display device, comprising:
a timing controller generating a scan driving control signal, a data driving control signal, and a light emitting driving control signal;
pixels;
a scan driver supplying scan signals to the pixels in response to the scan driving control signal;
a data driver supplying data signals to the pixels in response to the data driving control signal; and
a light emitting driver supplying light emitting control signals to the pixels in response to the light emitting driving control signal,
wherein each of the pixels comprises:
a light emitting diode;
a first transistor including a gate electrode connected to a first node, the first transistor electrically connecting a first driving power supply and a second node connected to an anode electrode of the light emitting diode;
a second transistor electrically connecting a data line and the first node;
an auxiliary transistor connected between the data line and the second transistor;
a capacitor connected between the first node and the second node;
a third transistor electrically connecting a first power supply and the second node;
a fourth transistor electrically connecting the first driving power supply and the first transistor; and
a fifth transistor electrically connecting a reference power supply and the first node, and
wherein the second transistor and the auxiliary transistor have a first overlapping turn-on period, and the second transistor is turned off before the auxiliary transistor is turned off.

12. The display device of claim 11, wherein the second transistor includes polysilicon as an active layer, and the auxiliary transistor includes an oxide semiconductor as an active layer.

13. The display device of claim 12, wherein each of the first transistor, the third transistor, and the fourth transistor includes polysilicon as an active layer.

14. The display device of claim 13, wherein the fifth transistor includes the oxide semiconductor as an active layer.

15. The display device of claim 14, wherein the first transistor, the second transistor, the auxiliary transistor, the third transistor, the fourth transistor, and the fifth transistor are N-type transistors.

16. The display device of claim 11, wherein a gate electrode of the second transistor is connected to a first scan line, a gate electrode of the auxiliary transistor is connected to a second scan line, a gate electrode of the third transistor is connected to a third scan line, and a gate electrode of the fifth transistor is connected to a fourth scan line.

17. The display device of claim 16, wherein the first scan line, the second scan line, the third scan line, and the fourth scan line are different from each other.

18. The display device of claim 17, wherein a gate electrode of the fourth transistor is connected to a light emitting control line.

19. The display device of claim 18, wherein the third transistor and the fifth transistor have a second overlapping turn-on period and the third transistor is turned off before the fifth transistor is turned off.

20. The display device of claim 19, wherein the second overlapping turn-on period is before the first overlapping turn-on period.

* * * * *